United States Patent [19]

Harari

[11] Patent Number: 5,327,375
[45] Date of Patent: Jul. 5, 1994

[54] DRAM CELL UTILIZING NOVEL CAPACITOR

[76] Inventor: Eliyahou Harari, 2320 Friars La., Los Altos, Calif. 94022

[21] Appl. No.: 24,917

[22] Filed: Mar. 2, 1993

Related U.S. Application Data

[60] Continuation of Ser. No. 868,793, Apr. 15, 1992, abandoned, which is a division of Ser. No. 551,557, Jul. 10, 1990, Pat. No. 5,136,533, which is a division of Ser. No. 216,873, Jul. 8, 1988, Pat. No. 4,958,318.

[51] Int. Cl.[5] .................................. G11C 11/401
[52] U.S. Cl. ........................... 365/149; 365/189.04; 365/182; 257/309
[58] Field of Search ............... 365/149, 52, 174, 182, 365/189.04; 357/23.6, 59; 257/309

[56] References Cited

U.S. PATENT DOCUMENTS

| | | |
|---|---|---|
| 4,300,212 | 11/1981 | Simko .................................. 365/185 |
| 4,612,629 | 9/1986 | Harari . |
| 4,650,544 | 3/1987 | Erb . |
| 4,651,184 | 3/1987 | Malhi . |
| 4,752,819 | 6/1988 | Koyama . |
| 4,792,834 | 12/1988 | Uchida . |
| 4,797,719 | 1/1989 | Ueda . |
| 4,801,989 | 1/1989 | Taguchi . |
| 4,845,539 | 7/1989 | Inoue . |
| 4,890,145 | 12/1989 | Malhi . |
| 4,907,047 | 3/1990 | Kato . |
| 4,914,628 | 4/1990 | Nishimura . |
| 4,937,641 | 6/1990 | Sunami . |

FOREIGN PATENT DOCUMENTS

| | | | |
|---|---|---|---|
| 53-123687 | 10/1978 | Japan | ..................... 257/309 |
| 56-94655 | 7/1981 | Japan | ..................... 257/309 |
| 59-61063 | 4/1984 | Japan | ..................... 257/309 |
| 61-12058 | 1/1986 | Japan | ..................... 257/309 |
| 61-23661 | 6/1986 | Japan | ..................... 257/309 |

OTHER PUBLICATIONS

Chatterjee et al., "A Survey of High Density Dynamic DRAM Cell Concepts" IEEE Trans. Electron Devices, vol. ED27, No. 6 (Jun. 1979), pp. 827–839.
Lee et al., "A 64Kb MOS Dynamic RAM," IEEE Digest of Technical Papers 1979 ISSCC, pp. 146–147 no month.
Koyanagi et al., "Novel High Density, Stacked Capacitor MOS RAM", Technical Digest of IEEE 1978 International Electron Devices Meeting, pp. 348–351 no month.
Chatterjee et al., "Trench and Compact Structures for dRAMs", Technical Digests of IEEE International Electron Devices Meeting, Dec. 1986, pp. 128–131.
Inoue et al., "A 16 Mb DRAM with an Open Bit-Line Architecture," IEEE 1988 ISSCC Digest of Technical Papers, p. 246 no month.
Kotani et al., "A Highly Reliable Selective CVD-W Using SIH4 Reduction for VLSI Contacts" IEEE 1987 IEDM Digest of Technical Abstracts, pp. 217–220 no month.
Kaga et al., "A 4.2 Micro[2] Half-VCC Sheath-Plate Capacitor DRAM Cell with Self-Aligned Buried Plate-Wiring", IEEE 1987 IEDM Digest of Tech. Papers no month.
Sakurai et al., Transparent-Refresh DRAM (TReD) Using Dual-Port DRAM Cell IEEE 1988 Custom Integrated Circuits Conference, p. 4.3.1 no month.
Furuyama et al., "An Experimental 2-Bits/Cell Storage DRAM for Macro Cell or Memory-on-Logic Application," IEEE 1988 Custom Integrated Circuits Conference no month.

(List continued on next page.)

Primary Examiner—Joseph E. Clawson, Jr.
Attorney, Agent, or Firm—Steven F. Caserza

[57] ABSTRACT

A dynamic RAM is provided with enhanced charge storage capacity by increasing the surface area between the two electrodes of the storage capacitor. The first electrode consists of a thick conductive layer whose vertical sidewalls provide the extra surface area for charge storage. The second electrode is used to partially planarize the surface topology. The first electrode can also be used as the gate of a sensing transistor in a signal amplifying cell, as well as in multiport and multistate dynamic RAM cells.

8 Claims, 16 Drawing Sheets

OTHER PUBLICATIONS

A Survey of High Density Dynamic RAM Cell Concepts, *IEEE Trans. Electron Devices vol. ED26, No. 6, Jun. 1979, pp. 827–839,* Chatterjee et al.

A 64Kb MOS Dynamic RAM, *IEEE Digest of Technical Papers,* 1979 ISSCC, pp. 146–147, Lee et al. no month.

Novel High Density, Stacked Capacitor MOS RAM, Technical Digest of IEEE 1978 International Electron Devices Meeting, pp. 348–351, Koyanagi et al., no month.

Trench and Compact Structures for dRAMS, Technical Digests of IEEE International Electron Devices Meeting, Dec. 1986, pp. 128–131, Chatterjee et al.

A 16 Mb DRAM with an Open Bit-Line Architecture, IEEE 1988 ISSCC Digest of Technical Papers, p. 246, Inoue et al. no month.

A Highly Reliable Selective CVD-W Using $SiH_4$ Reduction for VLSI Contacts, IEEE 1987 IEDM Digest of Technical Abstracts, pp. 217–220, Kotani et al. no month.

Transparent-Refresh DRAM (TReD) Using Dual-Ort DRAM Cell, IEEE 1988 Custom Integrated Circuits Conference, p. 4.3.1, Sakurai et al. no month.

An Experimental 2-Bits/Cell Storage DRAM for Macro Cell or Memory-on-Logic Application, IEEE 1988 Custom Integrated Circuits Conference, p. 4.4.1 Furuyama et al. no month.

DRAM CELL UTILIZING NOVEL CAPACITOR

CROSS REFERENCE TO RELATED APPLICATIONS

This application is a continuation of U.S. application Ser. No. 07/868,793, filed Apr. 15, 1992 abandoned which is a divisional application of Ser. No. 07/551,557, filed Jul. 10, 1990, U.S. Pat. No. 5,136,533 which in turn is a divisional of Ser. No. 07/216,873, filed July 8, 1988 U.S. Pat. No. 4,958,318.

BACKGROUND OF THE INVENTION

This invention relates to dynamic random access memory (DRAM) cells and in particular to a DRAM cell which has greatly enhanced storage capacity as well as immunity to alpha particles and which is highly scalable.

In recent years DRAM technology has progressed steadily to the point that 1 Megabit devices are presently mass produced while 4 Mbit and 16 Mbit devices are in advanced stages of development. These DRAM devices all employ a single transistor as a transfer device and a storage capacitor per bit. Each successive generation of DRAM cells has resulted in smaller device geometries, smaller cell sizes, a diminishing storage capacitance, and an increasing number of cells sharing a common bit line. To maintain an acceptable signal-to-noise level, the DRAM industry has focused the majority of its efforts on improving the charge storage efficiency per unit of silicon area for the storage capacitor.

One of the earliest commercial single transistor DRAM cells is shown in cross section in FIG. 1a. Cell 100 is known as a planar cell and includes an MOS transistor having drain 101, source 102, gate 103, and channel region 105. Storage capacitor C is formed between plate 104 and substrate 106 across a thin dielectric layer 109. Adjacent cells are isolated from each other via an isoplanar oxide 107 overlying a channel stop region 108. Each cell 100 in a memory array is uniquely accessed through a bit line 111 connected to drain 101 and an orthogonal word line connected to gate 103. Plate 104 of the storage capacitor is a conductive layer held at a fixed voltage, usually ground or the supply voltage. The cell is written by turning on the transfer transistor and either charging or discharging capacitor C. During reading, the contents of capacitor C is dumped onto the precharged bit line and is sensed at a sense amplifier (not shown) as either a low (if charge flows from the bit line into capacitor C) or as a high (if charge stored on capacitor C flows into the bit line). A high ratio of cell capacitance C to the parasitic capacitance of the bit line is key for the reliable operation of the DRAM cell over a wide range of operating temperatures. Typically, the bit line capacitance should not be more than approximately 15 times the cell capacitance C.

To enhance the storage capacitance C of cell 100, prior art devices have used techniques such as reducing the thickness of storage dielectric 109 to below 10 nanometers or have optimized the surface doping concentration of substrate 106—the so called HIGH-C cell, as described, for example in Chatterjee et al., "A Survey of High Density Dynamic RAM Cell Concepts," *IEEE Trans Electron Devices*, volume 26, number 6 (June 1979). However, for devices of greater than 1 Mbit, cell 100 and in particular planar capacitor C, are nearing the end of their usefulness due to the inability of a planar structure to provide adequate storage capacitance in an ever decreasing cell area.

A variation of the planar capacitor structure has been proposed by I. Lee et al., "A 64Kb MOS Dynamic RAM," *IEEE Digest of Technical Papers from 1979 ISSCC*, p. 146. This cell is known as the stacked capacitor cell, and is shown in cross section in FIG. 1b. A similar, more compact stacked capacitor cell has been proposed by M. Koyanagi et al in an article entitled "Novel High Density, Stacked Capacitor MOS RAM," *Technical Digest of IEEE 1978 International Electron Devices Meeting*, p. 348. Two variations of this cell are shown in cross section in FIGS. 1b and 1c. Cell 200 (FIG. 1b) and cell 300 (FIG. 1c) both have their storage capacitor C implemented across a thin dielectric film 209, 309 sandwiched between two storage electrodes consisting of a bottom plate of N+ doped polysilicon 214, 314 and a top plate of N+ doped polysilicon 204, 304, respectively. The bottom plate is electrically connected to source 202, 302 of the transfer transistor through a buried contact connection 215, 315. The main difference between cell 200 and cell 300 is that the latter folds part of the capacitor back over access gate 303, thereby using a greater part of the total available cell area for storage than the former. Cells 200 and 300 employ thicknesses of between 200 and 500 nanometers for all three polysilicon layers $P_1$, $P_2$, and $P_3$, so as to minimize the metal step coverage problems inherent to a triple polysilicon layer surface topology.

The stacked capacitor cells provide somewhat greater storage efficiency than planar cells. They are also less susceptible to upset from local hits by high energy ionizing particles such as alpha particles. This is because only the relatively small area around junction 202 or 302 can collect charge carriers generated in substrate 213, 313 by an incident high energy particle. In contrast, the planar cell capacitor (FIG. 1a) stores its charge at the surface depletion layer 106 and is therefore quite susceptible to such alpha particle hits.

Despite these advantages the stacked capacitor DRAM cell has not seen wide acceptance. The main reason for this is that the stacked capacitor cell still employs a planar capacitor and therefore has limited scalability as the cell becomes smaller and smaller.

Because of area limitation of the planar and stacked capacitor DRAM cells, a major thrust has been undertaken by DRAM manufacturers to develop a third type of cell—the trench DRAM cell. An example of the simplest of such cells is given in the cross sectional view of FIG. 1d.

The prior art trench DRAM cell 400 of FIG. 1d includes an access transistor consisting of gate 403 which is part of a word line, drain 401 which is part of a bit line, storage node 402, and trench capacitor C which is electrically connected to storage node 402. Trench capacitor C consists of a deep trench etched into the silicon surface with essentially vertical walls 416, N+ diffused silicon region 414 serving as the first electrode of trench capacitor C, dielectric insulation layer 409, and polycrystalline silicon field plate 404 serving as the second electrode of the trench capacitor. The storage capacitance of trench capacitor C can be increased by making the trench deeper. Oxide isolation regions 407 are used to isolate cell 400 from adjacent cells and trenches in a memory array.

There are several other variations of the use of the trench structure for high density DRAM cells. A good review article of the various DRAM cells previously proposed is provided by P. Chatterjee et al., "Trench and Compact Structures for DRAMs", *Technical Digests of IEEE International Electron Devices Meeting*, December 1986, p. 128.

Although Trench DRAM cells offer much better area storage efficiency than the planar or stacked capacitor cells and are therefore more scalable, they are extremely complicated to manufacture.

An example of an extremely complex trench cell is provided by M. Inoue et al., "A 16 Mbit DRAM with an Open Bit Line Architecture," *IEEE* 1988 *ISSCC Digest of Technical Papers*, p. 246 Inoue achieves an exceedingly small cell (1.5 microns×2.2 microns=3.3 microns$^2$) with a rather high storage capacity of 50 femtoFarad by using a narrow trench to completely surround the outer perimeter of the MOS transfer transistor, using the polysilicon plate which fills the trench also to serve as the device isolation area. This type of structure requires that the storage capacitor trench be submerged below the transfer transistor to a depth of more than 3.0 microns below the silicon surface, making the fabrication of this structure extremely difficult, and not realistically practical.

Some of the difficulties which are commonly encountered in forming trench DRAM cells are etch uniformity in etching the deep small diameter cylindrical trench cavities, keeping the inner vertical walls 416 clean from contamination, redeposition of etched material, growing or depositing uniform thin films of high quality dielectrics 409, assuring good vertical conformality of the polycrystalline plate 404, maintaining a flat surface topology and preventing leakage between adjacent trenches. These difficulties will become more severe with future generation trench DRAMs requiring ever deeper trench storage capacitors. For example, in etching 4 million trenches required for a 4 Mbit device, it is impossible to assure that all trenches have been etched to the same depth. Therefore, some memory cells may end up with shallower trenches, resulting in smaller storage capacitors than their neighboring cells.

SUMMARY OF THE INVENTION

In accordance with this invention a new DRAM cell is disclosed which combines some of the best attributes of the stacked capacitor cell with those of trench DRAM cells without the use of trench capacitors etched into the silicon substrate. The new DRAM cell, called Sidewall Storage Capacitor (S$^2$C) cell, employs a triple polysilicon construction similar to prior art stacked capacitor cell 300, with a major modification that the second layer of doped polysilicon, P$_2$, which serves as the bottom plate of the storage capacitor, is deposited to a much greater thickness than in any prior art devices. When this layer is etched to form the capacitor plate, its sidewalls provide a significant addition to the area available for charge storage. These tall sidewalls facing out from polysilicon layer P$_2$ in the S$^2$C cell are in fact quite analogous to the vertical sidewalls facing inward in the trench capacitor structure. However, whereas a trench is confined to a fixed physical location adjacent to the transfer transistor, the P$_2$ plate with its tall sidewalls can be made to overly the transfer transistor or any other surface area, thereby significantly increasing the storage capacitance for a given cell area.

In one embodiment of this invention, the new S$^2$C device and process flow for manufacturing DRAMS are described. In a second embodiment, the new S$^2$C cell is used to form highly compact multiport DRAM structures. In a third embodiment, the S$^2$C is used to form a DRAM cell having signal amplification, which is particularly suitable for high speed sensing as well as for storage of more than one bit per storage cell, and for multiport DRAM structures having signal amplification.

BRIEF DESCRIPTION OF THE DRAWINGS

FIG. 2b is a cross-sectional view along AA of the structure of FIG. 2a;

FIG. 2c is a circuit schematic of the DRAM cell of FIG. 2a;

FIG. 3b is a circuit schematic of the dualport DRAM cell of FIG. 3a;

FIG. 4b is a top view of the DRAM cell of FIG. 4a;

FIG. 4c is a circuit schematic of the DRAM cell of FIG. 4a;

FIG. 5b is a circuit schematic of the multiport DRAM cell of FIG. 5a;

DETAILED DESCRIPTION

Sidewall Storage Capacitor DRAM Cell

Figure 2A:
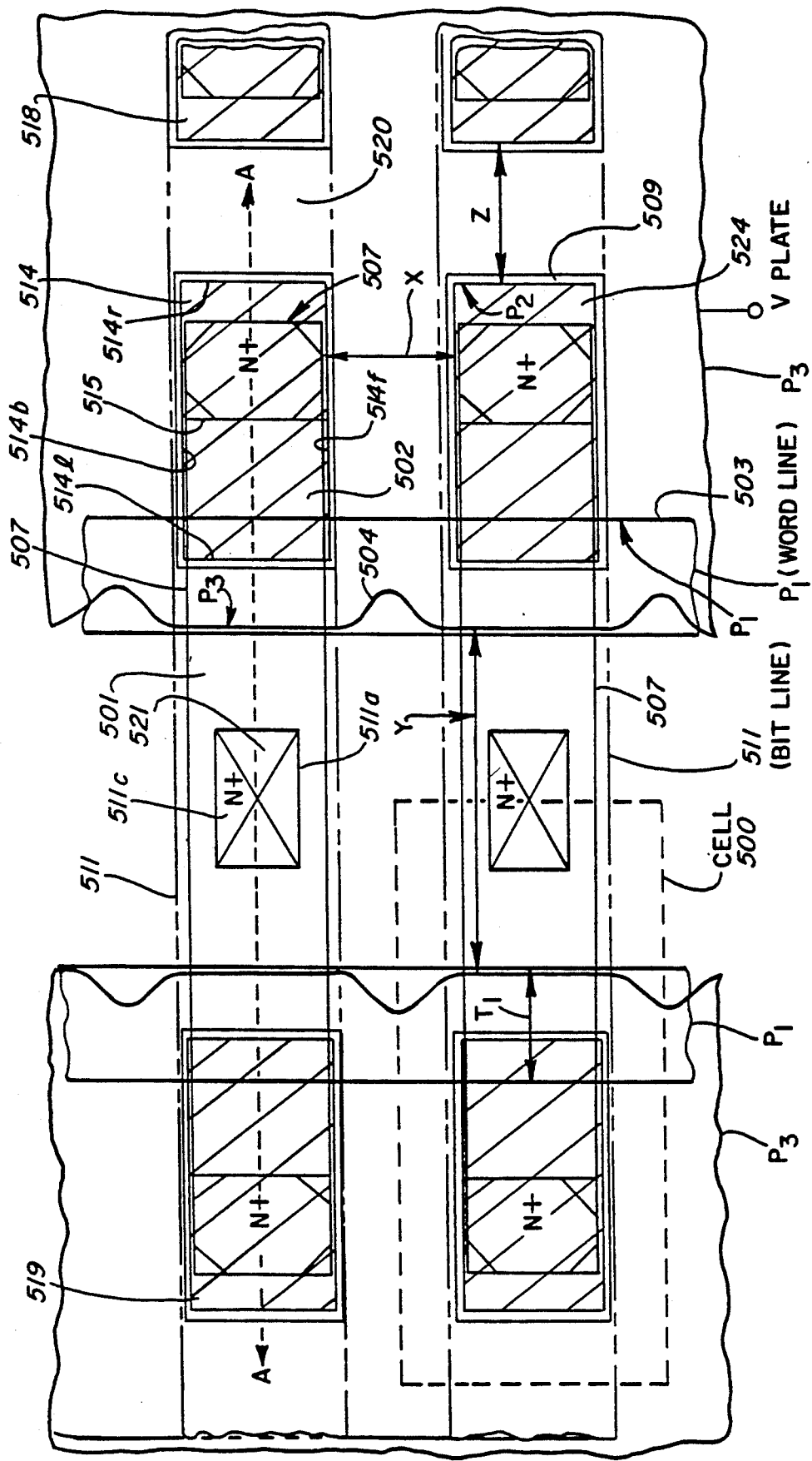
FIG. 2a is a top view of a 2×2 memory array of one embodiment of S$^2$C cells constructed in accordance with the teachings of this invention.
Figure 2B:
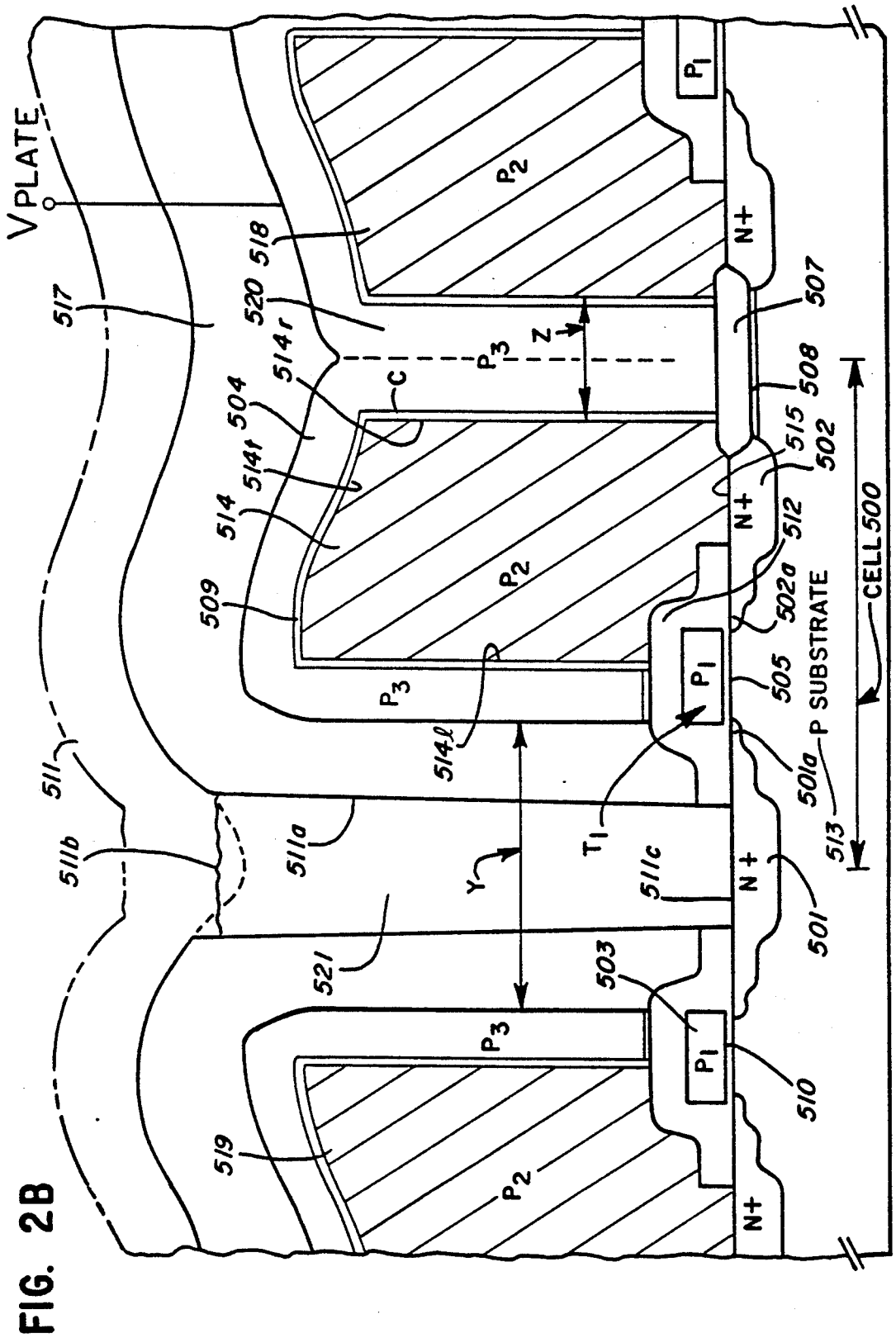
Figure 2C:
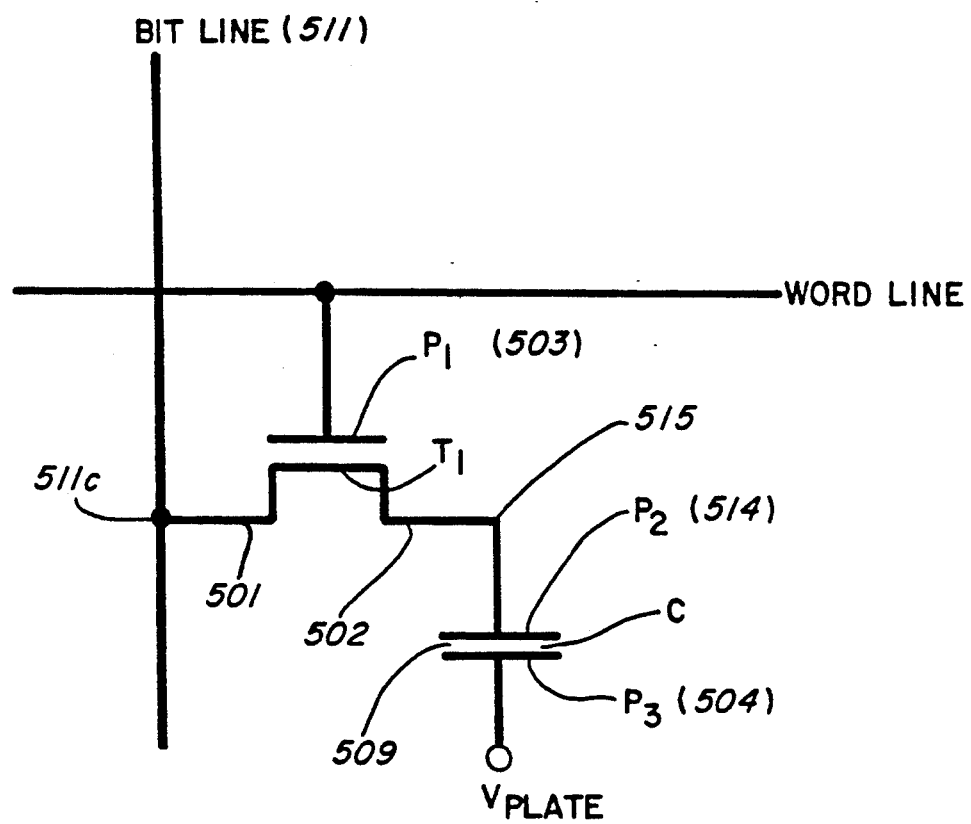

FIG. 2a is a top view of a 2×2 array of memory cells 500 constructed in accordance with one embodiment of this invention. A cross sectional view along line AA of the structure of FIG. 2a is provided in FIG. 2b, and a circuit schematic is shown in FIG. 2c. S$^2$C cell 500 consists of transfer transistor T$_1$ electrically connected to storage capacitor C. Transfer transistor T$_1$ is a short channel MOSFET with gate 503, N+ doped source 502 and drain 501, P doped channel 505, and gate insulator 510. If desired, the drain and source diffusions can also have lightly N doped structures 501a and 502a respectively, to reduce hot channel electron effects. Gate material $P_1$ can be N+ doped polysilicon or a low resistivity silicide or a refractory metal, of thickness typically between 200 and 400 nanometers. Gate insulator 510 is normally thermal silicon dioxide of thickness between 10 and 25 nanometers. Gate 503 is insulated from other conductors overlying it by dielectric insulation film 512, which may be a thermally grown silicon dioxide, silicon nitride, or a combination of the two. It is possible, for example, to use an N+ doped polysilicon layer $P_1$ for gate 503 and to grow by differential oxidation a relatively thick (200 to 300 nanometer) oxide 512 over the surface of polysilicon layer $P_1$ while simultaneously growing a much thinner oxide (not shown) over the silicon substrate surface. The thinner oxide can then be removed by a short etching without removing the thicker oxide insulating gate 503. This permits minimum spacing between gate 503 and buried contact opening 515 i.e. the buried contact is selfaligned to the edge of gate 503.

The active transistor surface area is surrounded by a field oxide 507 (typically 200 to 400 nanometers thick) overlying a P type field isolation implant region 508. Although the foregoing discussion is for an NMOS transfer transistor, a PMOS structure can be employed equally well.

Buried contact opening 515 in insulator 512 provides direct electrical contact between source 502 and the second conductive polysilicon plate $P_2$ (514). Source diffusion 502 is the junction isolated storage node for charge residing at capacitor C. The storage capacitance of the junction formed between N+ diffusion 502 and P type substrate 513 can be enhanced by increasing the P type doping concentration of the substrate region in contact with source 502. Such heavier P type doping can, for example, be achieved by ion implantation of boron through the buried contact opening 515 so as to confine it essentially to the area occupied by source diffusion 502. However, this step is not essential for proper operation of the device.

Polysilicon plate $P_2$ is formed as a very thick layer of heavily N+ (or P+) doped polysilicon. The actual thickness of this layer determines to a large extent the storage capacitance C of the cell. Its thickness can be chosen to be from as little as 0.5 to 1.0 microns on the low end to as much as 5.0 to 7.0 microns on the high end. More typically, for acceptable storage capacitance, a practical thickness is in the 1.0 to 3.0 micron range. Polysilicon layer $P_2$ can be deposited by low pressure chemical vapor deposition (LPCVD) and can be doped either in situ during deposition or, subsequent to deposition, by diffusion or ion implantation followed by a thermal drive. In the case of ion implantation of phosphorus or arsenic, the thermal drive step can be performed after etching polysilicon layer $P_2$ to form islands. This way, the N+ dopant in polysilicon layer $P_2$ dopes the silicon substrate only where electrode 514 overlays a buried contact opening. Polysilicon layer $P_2$ is made deliberately thick so as to provide as much surface area as possible along its vertical walls $514l$, $514r$, $514f$ and $514b$ (FIGS. 2a and 2b). These vertical walls are formed when conductor layer 514 is etched, for example, by anistrophic reactive ion etching (RIE) of polysilicon layer $P_2$. Using an etch selectivity of approximately 30:1 between the polysilicon and oxide 512,507 protecting the structure, it is possible to significantly overetch polysilicon layer $P_2$ to assure that there are no polysilicon stringers shorting between adjacent islands of polysilicon $P_2$, such as islands 514 and 518. A photoresist mask or an oxide or nitride mask can be used to protect the islands during this etch step. In cell 500, polysilicon layer $P_2$ forms a plate which extends over insulator 512 over transfer gate 503 and also over a portion of field isolation oxide 507. The ability to overetch polysilicon layer $P_2$ without attacking significantly the underlying structure allows the formation of large arrays of memory cells each having the same height of vertical walls (as compared to capacitors formed along walls of trenches etched into the silicon, where there is no natural etch stop to ensure a uniform depth for all trenches).

A very thin storage dielectric 509 is grown or deposited over all exposed surfaces $514l$, $514r$, $514f$, $514b$ and $514t$ of polysilicon layer $P_2$. This dielectric ranges in thickness from less than 10 nanometers to 20 nanometers. It can be thermal silicon dioxide or LPCVD silicon nitride or a combination of the two, or it can be any other dielectric having a high dielectric constant and a good conformality and low leakage to evenly cover and insulate all exposed surfaces of polysilicon layer $P_2$.

The second plate of the storage capacitor is formed as a third conductive layer 504 deposited on top of storage dielectric 509. Conductive layer 504 is, in this embodiment, heavily doped polysilicon layer $P_3$. Its thickness is chosen to be slightly greater than Z/2, where Z is the separation between adjacent polysilicon layer $P_2$ storage plates 514, 518 in an array of memory cells. In a dense memory array, z is 1.0 micron or less, and therefore layer 504 need not be thicker than approximately 0.5 microns. This choice of thickness is made so that the very steep steps formed in region 520 between the adjacent walls of islands of polysilicon layer $P_2$ such as 514 and 518 are completely filled by polysilicon layer $P_3$, making it possible for a subsequent metalization layer 511 to pass over spacing 520 without breaking or experiencing severe step coverage problems. Layer 504 is removed by a masking and etching step from areas in the memory array (such as bit line contacts 511c) which are to be contacted by metal layer 511. The structure is then coated with a relatively thick insulating/planarizing layer 517, which may typically be approximately 1 micron of borophosphosilicate glass or a polyamide. This layer is made to flow and tends to planarize the surface topology and fill gaps such as Y in between two cells such as 514 and 519 sharing a common drain 501 (note that in scaled devices this spacing Y is of the order of 2.0 microns and therefore a conformal film 517 of thickness slightly greater than 1 micron will readily planarize the steep step created at this gap). Via openings 511c are then etched vertically through this layer by anistrophic reactive ion etching, to expose drain region 501, as well as to allow contact to polysilicon layers $P_1$ and $P_3$. This etch step employs an etch selectivity of approximately 30:1 between oxide and silicon, thereby allowing etching of vias through different thicknesses of layer 517 without severely etching into polysilicon layers $P_1$, $P_3$, or drain 501 in the open vias. The vertical steep walls 511a inside this via opening necessitate the use of one of several via filling techniques. For example, H. Kotami et al., "A Highly Reliable Selective CVD-W Using SiH₄ Reduction for VLSI Contacts," *IEEE* 1987 *IEDM Digest of Technical Abstracts*, p. 217, describes a technique to selectively deposit tungsten in vias confined by vertical oxide walls. A selective deposition rate of approximately 0.3 microns per minute and a very low contact resistance were demonstrated by Kotami. Such a via filling technique can be a practical way for filling the very deep via up to a level 511b close to the top surface, thereby facilitating electrical contact between metalization layer 511 and drain region 501 through vertical conductive stud 521. Other via filling techniques are also possible. For example, a blanket deposition of CVD tungsten silicide or of LPCVD in situ doped polysilicon of thickness greater than the radius of the via opening will readily fill up the cavity of the via and provide an acceptably low series-contact resistance between drain 501 and metalization layer 511. Alternatively, thick conductive polysilicon layer $P_2$ can itself be used to serve as the vertical stud connecting metalization 511 and drain 501. In this case a buried contact opening must be provided through insulator 512 prior to deposition of polysilicon layer $P_2$ not just at the source region 515 but also at the shared drain region 501 underneath where the polysilicon layer $P_2$ stud is to be formed. Also, in this case, polysilicon layer $P_3$ should be carefully removed from the polysilicon layer $P_2$ stud prior to the deposition of planarization 517 to prevent shorting between polysilicon layer $P_3$ (which is the capacitor plate) and drain 501 or metalization 511.

Examining the DRAM structure of cell 500, it is evident that the introduction of an unusually thick polysilicon layer $P_2$ as one of the two plates of the storage capacitor C goes counter to conventional wisdom in device scaling because it results in a severe aggravation of the surface topology, which must be properly addressed by careful planarization. However, two factors alleviate this topology problem. First, device scaling results in a very small area per cell. Therefore, polysilicon layer $P_2$ structures from adjacent cells are sufficiently close to each other that it is relatively easy to fill up the gaps (such as Z and Y) between them with conformal films such as 504 and 517. Secondly, the trend to three and four levels of metalization in advanced integrated circuits has brought about the development of satisfactory planarization and deep via filling techniques, overcoming the step coverage problem inherent in steep vertical structures.

Comparing the structure of cell 500 (FIG. 2b) with the simplest trench capacitor DRAM cell 400 (FIG. 1d), it is seen that the etching of vertical walls 514l, 514r of polysilicon layer $P_2$ is considerably less difficult than the etching of vertical walls 416 inside a trench of a narrow aperture opening, there being a natural etch stop for the former but not the latter, and also there being less of a problem with redeposition of etched material or trapping of contamination. The problem of planarization and via filling in cell 500 is somewhat equivalent to the problem of properly filling the deep narrow trench of cell 400.

On the other hand the structure of storage capacitor C of cell 500 is far simpler to implement than the capacitor structure in advanced trench DRAM cells. For example, most advanced trench capacitors form the capacitor in between two thin layers of polysilicon embedded inside the trench cavity and using an ultrathin storage dielectric. It is quite difficult to form such storage dielectrics with high integrity several microns deep inside a trench whose aperture opening may have a diameter smaller than 0.7 microns. See, for example, T. Kaga et al., "A 4.2 Micron$^2$ HalfVCC Sheath-Plate Capacitor DRAM Cell with Self-Aligned Buried Plate-Wiring," *IEEE* 1987 *IEDM Digest of Technical Abstracts*, p. 332.

Another distinct advantage of the new Sidewall Storage Capacitor (S$^2$C) cell of this invention over prior art trench capacitor cells is that the S$^2$C cell is far less sensitive to soft error upset by an alpha particle hit as well as due to surface leakage. This is because most of the charge storage in the S$^2$C cell is at the vertical walls and top surface between capacitor plates $P_2$ and $P_3$, away from the silicon substrate. By contrast the trench capacitor is located deep into the substrate in the region most susceptible to upset by charge carriers generated by an incident alpha particle.

Figure 1A:
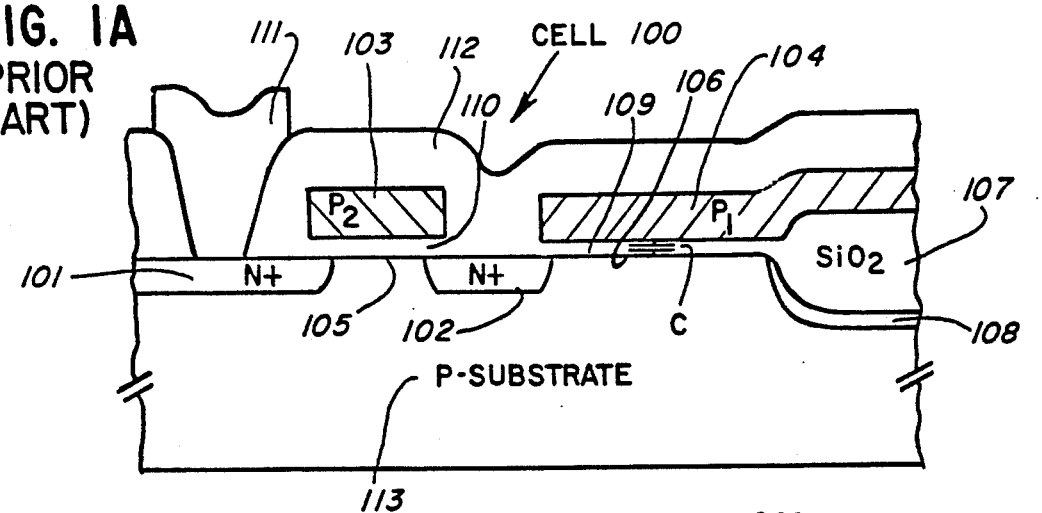
FIG. 1a is a cross sectional view of a prior art DRAM cell with a planar capacitor.
Figure 1B:
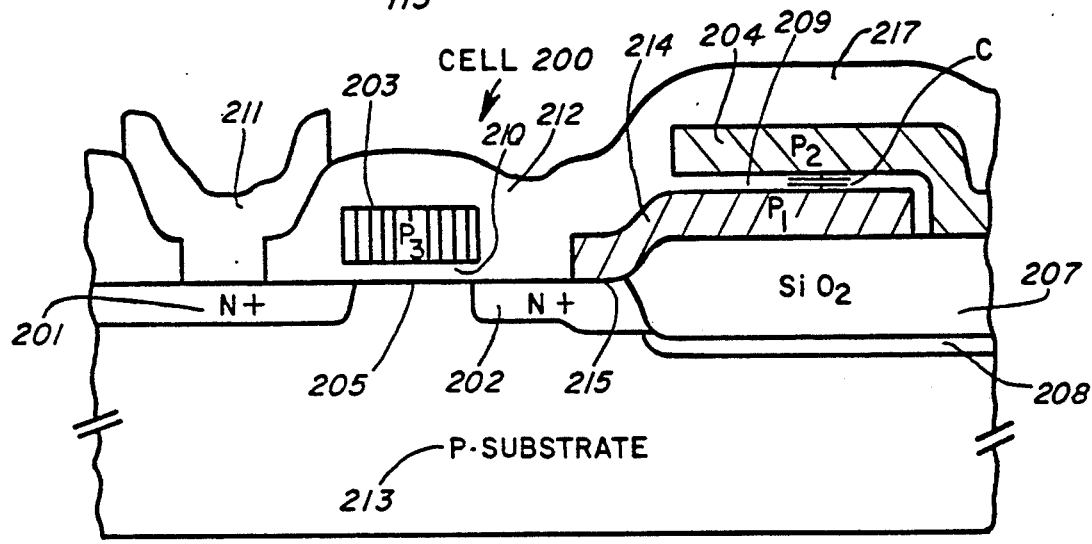
FIG. 1b is a cross sectional view of a prior art DRAM cell with a stacked capacitor.
Figure 1C:
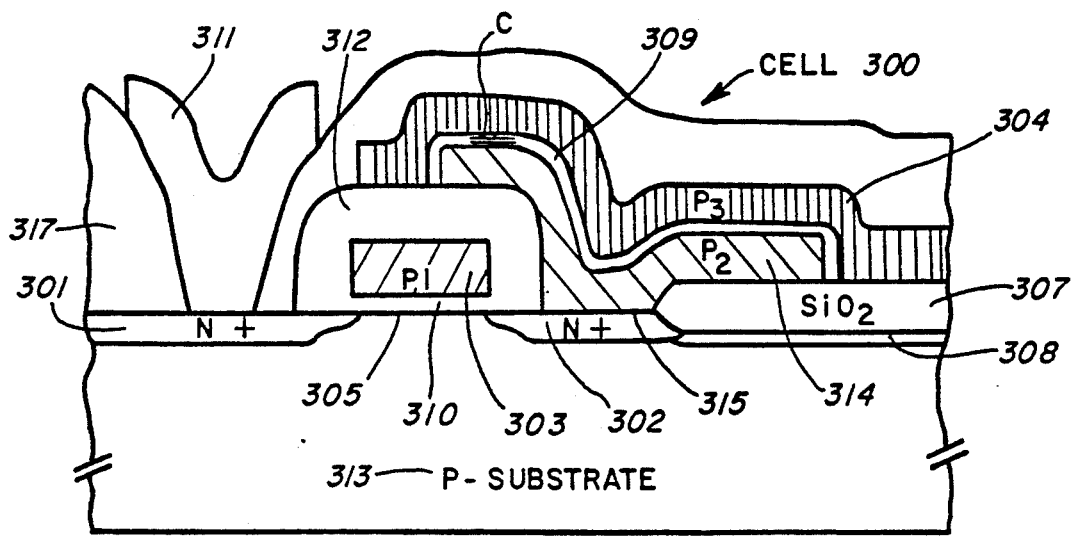
FIG. 1c is a cross sectional view of another prior art DRAM cell with a stacked capacitor.
Figure 1D:
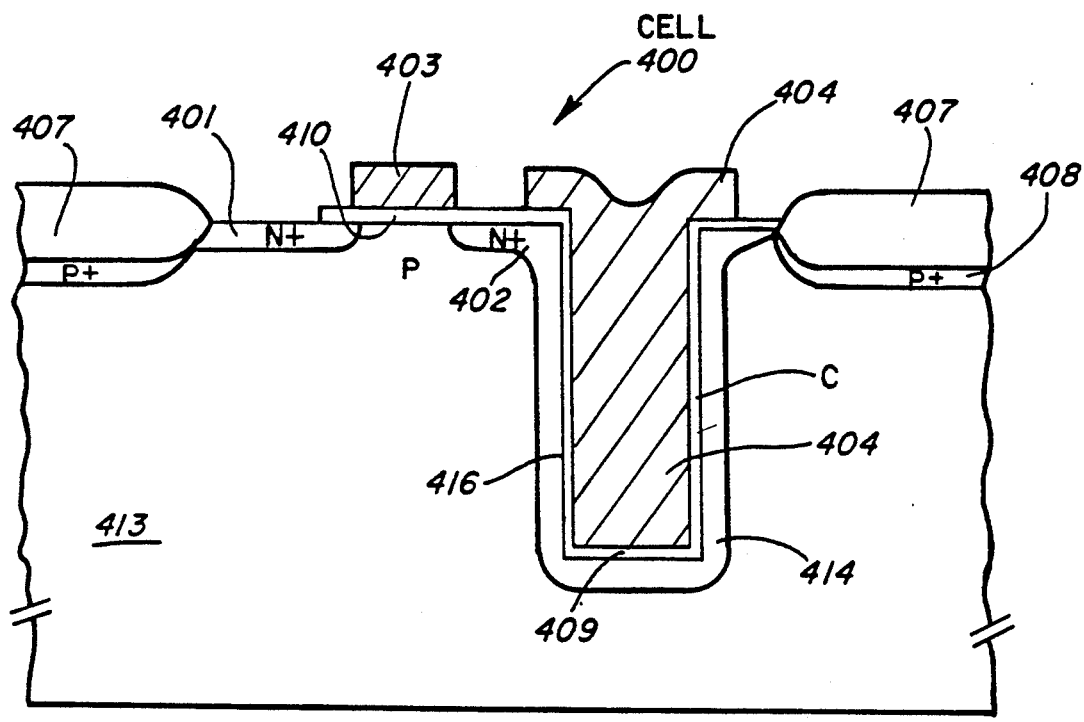
FIG. 1d is a cross sectional view of a prior art DRAM cell with a trench capacitor.

To properly assess the charge storage capability of the new S$^2$C cell, a comparison can be made between three competing cells: prior art stacked capacitor cell 300 of FIG. 1c, prior art stacked capacitor cell 400 of FIG. 1d, and S$^2$C cell 500 FIG. 2b, normalizing to the same cell area and same storage dielectric thickness for all three cells. Using for cell 400 the Kaga cell of the above referenced article as the reference, it has a cell size of 1.3 microns$\times$3.2 microns=4.2 microns$^2$. It uses a storage dielectric 5.5 nanometers thick and a trench 3.0 microns deep to achieve a storage capacitance of 51 femtoFarad. The total effective area of the capacitor plate buried inside the trench is approximately 9.0 microns$^2$ In the same cell area (4.2 microns$^2$), with same storage dielectric thickness, with polysilicon layer $P_2$ of 3.0 microns thickness, the total effective storage area of the S$^2$C cell 500 is given by:

$$A = s + t$$

where
  A = capacitor C storage area;
  s = sidewalls surface area of polysilicon layer $P_2$; and
  t = top surface area of polysilicon layer $P_2$.
Consequently, $$\begin{aligned} A &= (2 \times 1.6 \times 3.0 + 2 \times 0.6 \times 3.0) + (1 \times 1.6 \times 0.6) \\ &= (9.6 + 3.6) + 0.96 \\ &= 14.2 \text{ microns}^2 \end{aligned}$$

Therefore the storage capacitance of cell 500 is 80.5 femtoFarad, or 58% better than that of prior art trench cell 400. Of importance, the overwhelming contribution to the storage capacitor of cell 500 comes from the sidewall areas (13.2/14.2=93%). On the other hand, cell 300, with the same 4.2 microns$^2$ area, with the same storage dielectric, but with a polysilicon layer $P_2$ having thickness of only 0.3 microns, has a total effective storage area given by:

$$A = s + t$$

( as above ); and consequently, $$\begin{aligned} A &= (2 \times 1.6 \times 0.3 + 2 \times 0.6 \times 0.3) + (1 \times 1.6 \times 0.6) \\ &= (0.96 + 0.36) + 0.96 \\ &= 2.3 \text{ microns}^2 \end{aligned}$$

Therefore, cell 300 has a storage capacity of 13.0 femtoFarad, or only 25% of the Kaga cell 400 or 16.2% of the S$^2$C cell.

To operate the cell with adequate stability a minimum storage capacity of approximately 30 femtoFarads is required. Clearly cell 300 is not capable of supplying that magnitude of storage, which explains why it was by and large dropped by DRAM manufacturers in favor of trench cell 400. By the same token, however, S²C cell 500 provides significantly greater storage capacity per unit of cell area than does trench cell 400, and should therefore prevail as the cell of choice as further device scaling takes the trench cell below the 30 femtoFarad level.

The additional storage capacity per unit cell area in cell 500 can alternatively be traded off to relax the most critical device parameters. For example, the thickness of polysilicon layer P₂ can be reduced by approximately 58% to under 2.0 microns, or the storage dielectric thickness can be increased by approximately 58%, or the cell itself can be made smaller by perhaps 25%, yet maintaining a minimum storage capacitance in excess of 50 femtoFarads.

Another advantage of the S²C cell 500 is that since a trench is not used for charge storage, dielectric isolation 507 shown in FIGS. 2a, 2b can be replaced by a narrow isolation trench surrounding the perimeter of the active device surface area, thereby minimizing cell size.

In a DRAM memory chip the array of memory cells is surrounded by peripheral circuits. Polysilicon layer P₂ is etched away from all peripheral circuit areas, and polysilicon layers P₁ and P₃ can be used as gate and interconnect material. No unusual step coverage problems exist within this peripheral area. However, at the interface between the boundary of the memory array and the peripheral area there is a steep vertical step due to the vertical walls introduced by polysilicon layer P₂. Therefore vertical interconnect studs (or other methods), must be employed to serve as jumpers between metalization lines 511 inside the array and metal conductors in the peripheral area leading into the array. The use of more than one level of metalization can simplify this jumpering task.

A problem associated with the S²C cell may arise in the photolithographic step defining metal interconnect 511. Most advanced lithography mask aligners in use today have a depth of focus of less than 3.0 microns. This makes it difficult to properly focus on layer 511 simultaneously inside the memory array (where it is elevated by the thickness of polysilicon layer P₂) and in the periphery area (note, however, that X-ray lithography does not have this depth of focus limitation). There are several ways to overcome this problem. One is to dedicate metal layer 511 for use exclusively inside the memory array, using another layer of metalization in the periphery area. A second is to planarize the periphery area with a thick oxide or polyamide used for layer 517. A third is to form a step in the silicon substrate (either etch into the silicon in the area where the array is to be formed, or grow selective epitaxial layer of silicon in the periphery outside the array) so as to have the top surfaces of the memory array and the periphery at more or less the same elevation i.e. within the same depth of focus of the mask aligner.

A fourth way is to entirely circumvent the bit line or word line metal step coverage problem by not requiring these lines to run over the top surface 514t of electrodes P₂. For example, cell 500 (FIG. 2a) can be modified to have a rather thin (200 nonometers or less) layer of electrode P₃, so as to deliberately not completely fill the gap X between adjacent P₂ islands 514, 524. The remaining space in this gap can then be used to run the metal bit lines, which can be a refractory metal, LPCVD tungsten, tungsten silicide, or even aluminum. Thus these metal lines run astride the storage capacitors rather than on top of them, akin to a river running inside a canyon with steep vertical walls.

Multi-Port DRAM
Using the Sidewall Storage Capacitor Cell

Figure 3A:
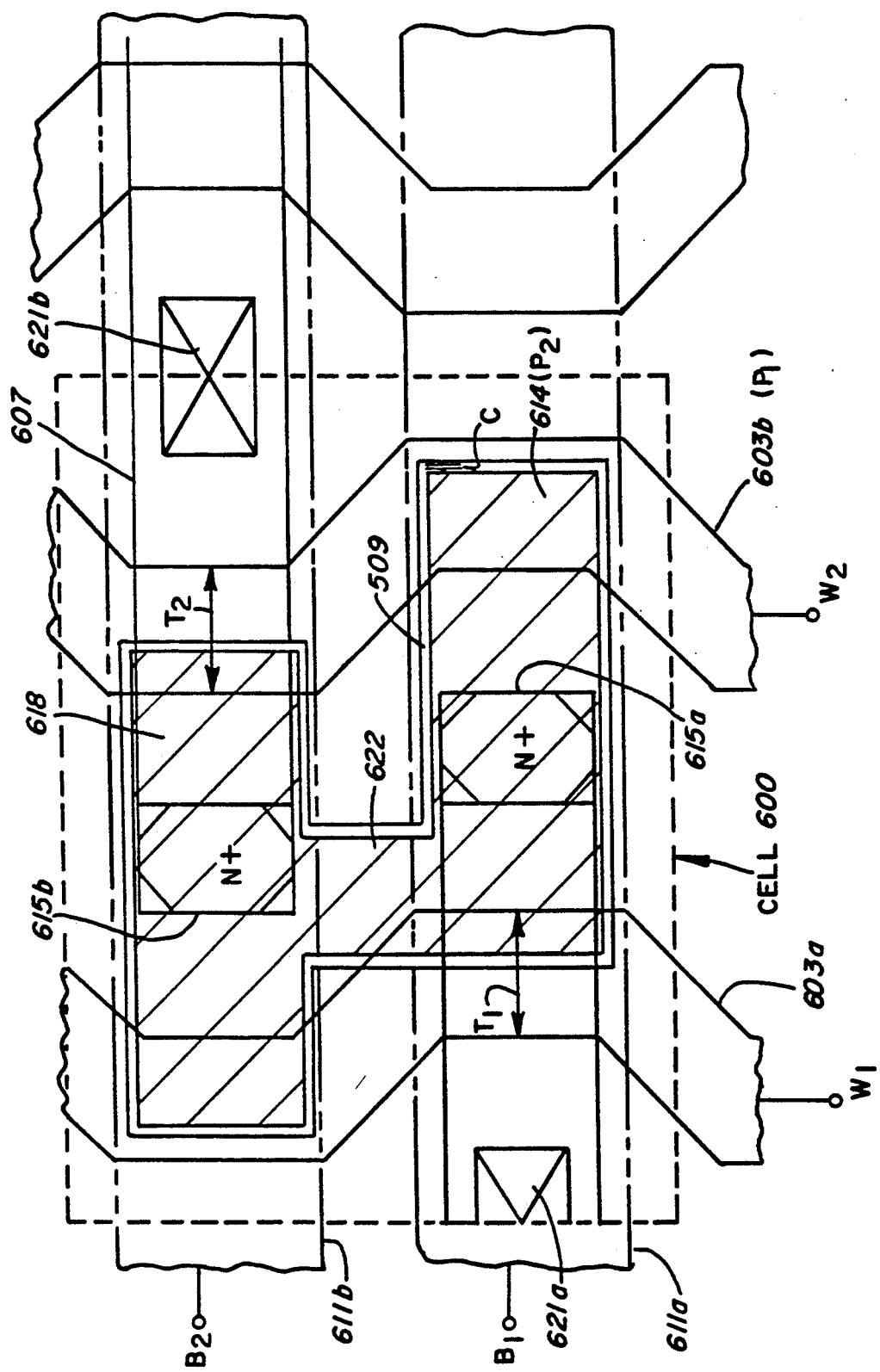
FIG. 3a is a top view of a dual-port DRAM cell employing an S$^2$C device in accordance with this invention.
Figure 3B:
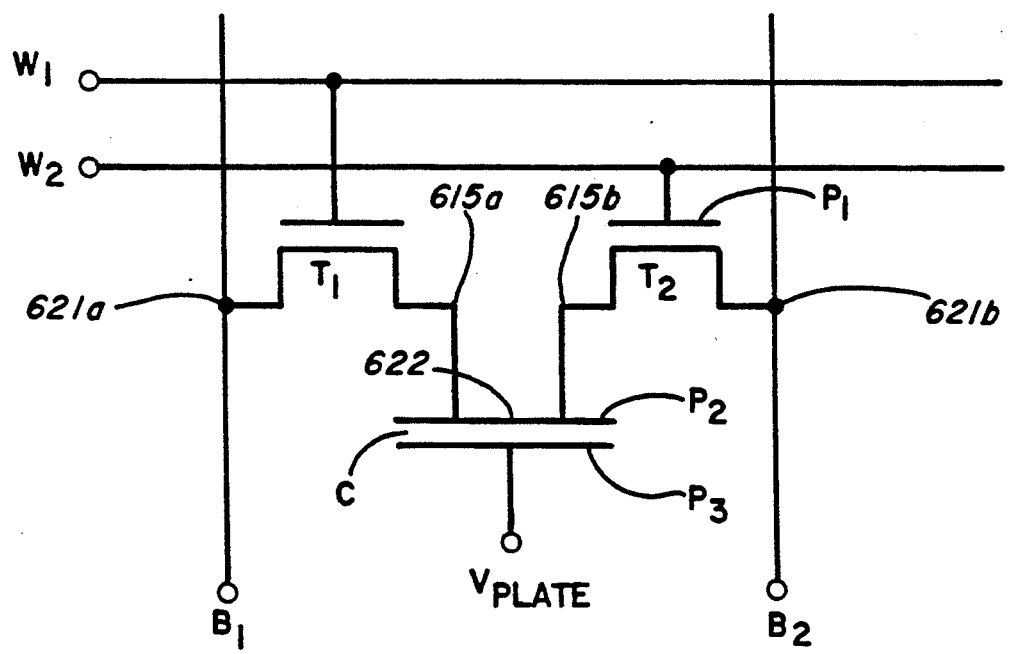

The versatility of the Sidewall Storage Capacitor can be exploited by using capacitor plate P₂ (FIG. 2a) also as an interconnect between two or more storage capacitors, each belonging to a different DRAM cell with its own transfer gate (word line) and drain contact (bit line). An example of a dual-port S²C DRAM cell 600 is shown in the top view of FIG. 3a (for clarity, the second capacitor plate P₃ surrounding all edges of plate P₂ and planarizing the topology is omitted). The same cell is shown in schematic form in FIG. 3b. Dual-port RAMs are normally used in applications where a data interface between two systems sharing a common database is required. Each system I/O port can independently address any memory location and read or alter the data stored at that address. Therefore it is necessary that each port have a dedicated word line and a dedicated bit line for each address of shared data. For example, a dual port RAM can be used as a FIFO (first-in, first-out) memory where one set of word lines and bit lines are used to write data into the memory at a first clock-cycle rate and the other set of word lines and bit lines are used to read the same data a second clock-cycle rate.

Prior art multiport RAMs have generally been implemented using a static RAM flip-flop storage element. Recently, T. Sakurai et. al described a dual port DRAM cell in "Transparent Refresh DRAM (TRED) Using Dual Port DRAM Cell," *IEEE* 1988 *Custom Integrated Circuits Conference*, p. 4.3.1

Sakurai implements a dual port DRAM cell by merging the planar capacitor of two adjacent cells. In so doing the storage capacity is approximately doubled relative to the standard DRAM cell, as is the area of the cell. A doubling of the storage capacitance is required for the case when both ports simultaneously access the cell, in which case the stored charge must be sufficiently large to correctly drive the bit line capacitances of two bit lines rather than one.

Sakurai proposes the use of the dual-port DRAM as a replacement for static RAM whereby one of the two ports is dedicated to periodic refresh operations while the other port is used for read/write only, and need not be used for refresh at all. Doubling the cell area to form such dual port RAM still results in a cell which is smaller than a flip-flop static RAM cell.

The S²C structure of this invention is particularly well suited for a multiple port operation for at least the following reasons. First, capacitor plate P₂ is also a conductor, which can be used to run over any number of transfer transistors such as transistors T₁ and T₂ (FIG. 3a) and to provide an electrical interconnection 622 between all buried contact openings (such as 615a, 615b) which share common data. This interconnecting property of polysilicon layer P₂ becomes more valuable as the number of ports sharing each address increases (i.e. the S²C structure can provide flexibility for constructing triple port, four port, etc. DRAM cells). Second, capacitor plate P₂ can be formed so as to cover any unused area of the cell so as to increase the storage capacity C by increasing the surface area of its steep vertical walls as well as its top surface. This is not possible with planar or trench capacitors where only a relatively small and immovable area is available for storage. For example, comparing the single port DRAM cell 500 of FIG. 2a with the dual port DRAM cell 600 of FIG. 3a one obtains the following relationship:

$$\frac{\text{Cell 600 Area}}{\text{Cell 500 Area}} = \frac{2.5}{1}$$

while $$\frac{\text{Capacitor C for cell 600}}{\text{Capacitor C for 500}} = \frac{2.9}{1}$$

This relatively large storage capacitance per cell all but assures its stability under coincident access from the two ports. Furthermore, the storage capacity increases even more with the addition of a third, fourth, or fifth ports. For example, a 5-port DRAM requires 5 times the capacitance of a single-port DRAM, yet with polysilicon layer $P_2$ interconnecting all five nodes sharing the common data, the storage capacitance of the 5-port cell may be between 7 and 10 times the capacitance of a single port DRAM.

A Multistate DRAM Using the Sidewall Storage Capacitor Cell

The $S^2C$ cell, because of its high efficiency for storage capacitance per unit area and high immunity to alpha particles, is ideally suited for storing more than one bit (i.e. more than two charge states) per cell. For example, the minimum size $S^2C$ cell can be enlarged by 70% relative to the minimum lithographic feature size possible. This makes manufacturing the enlarged cell considerably easier. The storage capacity inherent to the increased area of the vertical walls of polysilicon layer $P_2$ is increased by approximately 100%. This in turn allows storing two bits (i.e. four distinct states) in the enlarged cell without sacrificing the signal margin available per each of the four stored states. The net effect is that the area per bit is reduced by 15% while the manufacturing tolerances are actually relaxed. A prior art method of sensing any one of the four stored states without sacrificing access speed is described by T. Furuyama, et.al., "An Experimental 2 Bits/Cell Storage DRAM for Macro Cell or Memory-on-Logic Application," IEEE 1988 Custom Integrated Circuits Conference, p 4.4.1

A Sidewall-Storage Capacitor DRAM Cell with self Amplification of the Stored Data The versatility of the $S^2C$ cell can be further extended to DRAM cells which provide transistor amplification of the charge stored on their storage capacitor. An example of a prior art DRAM cell with self signal amplification is provided by E. Harari, in "Highly Scalable Dynamic RAM Cell with Self-Signal Amplification," U.S. Pat. No. 4,612,629.

Figure 4A:
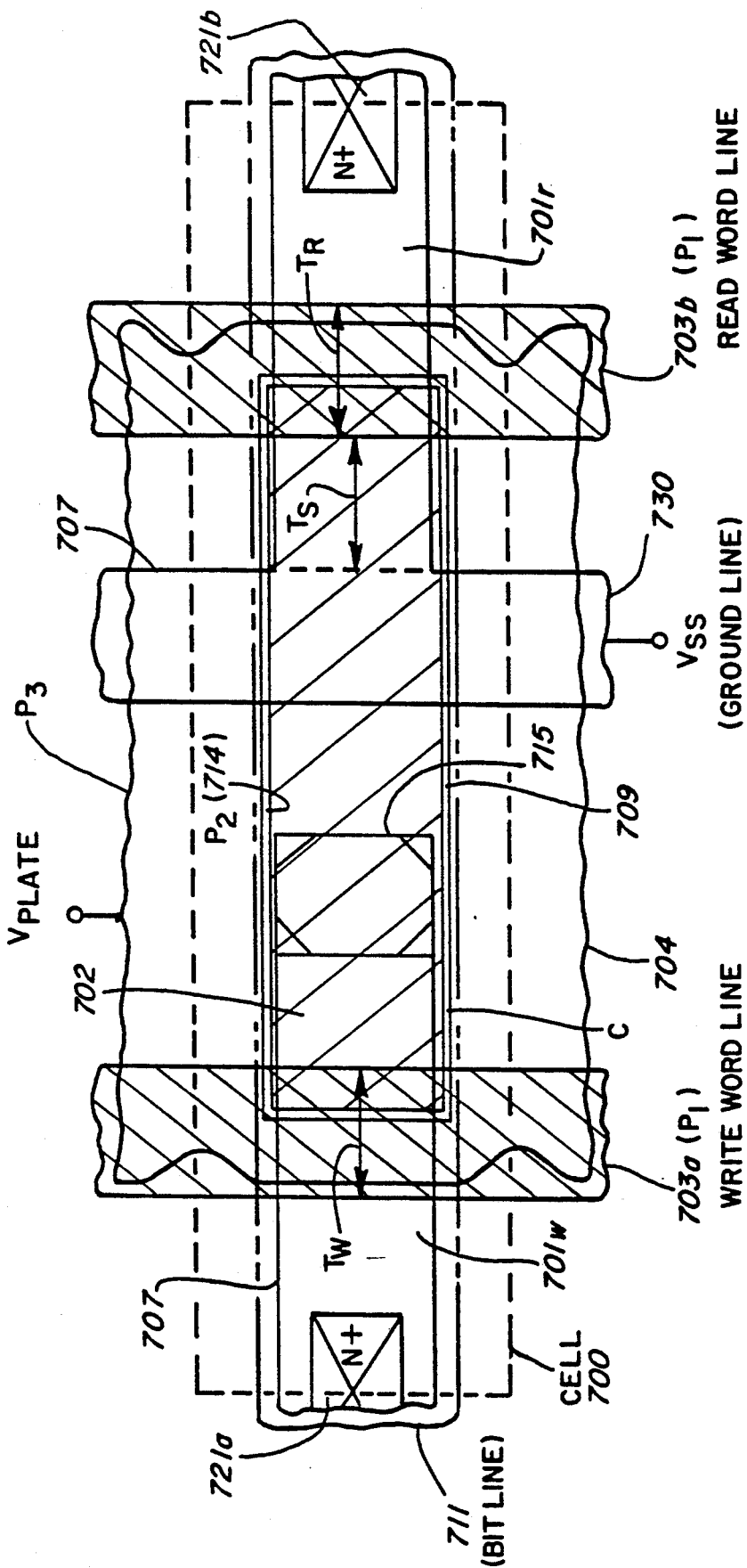
FIG. 4a is a cross sectional view of a DRAM cell having a self signal amplification using an S$^2$C cell in accordance with this invention.
Figure 4B:
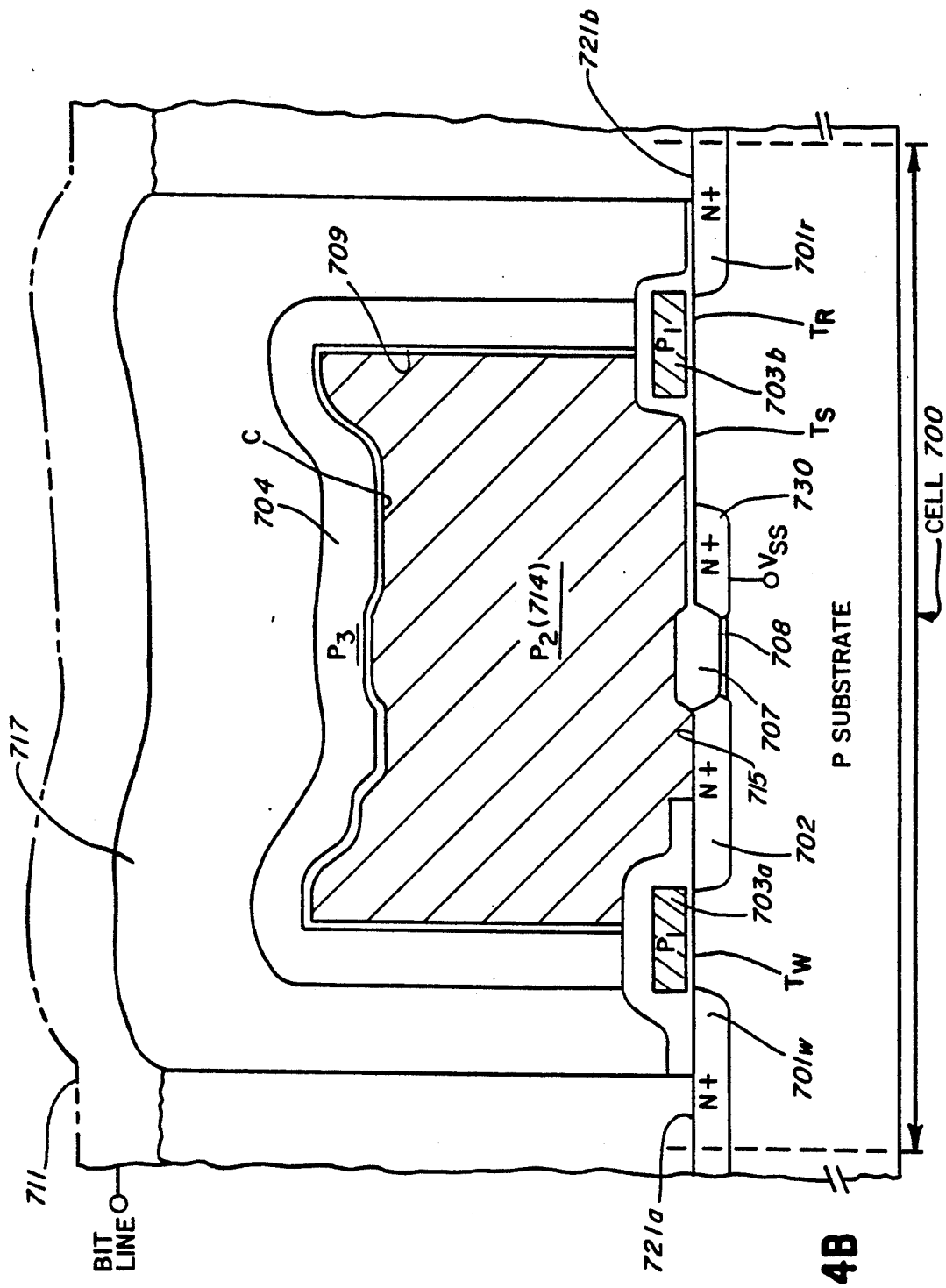
Figure 4C:
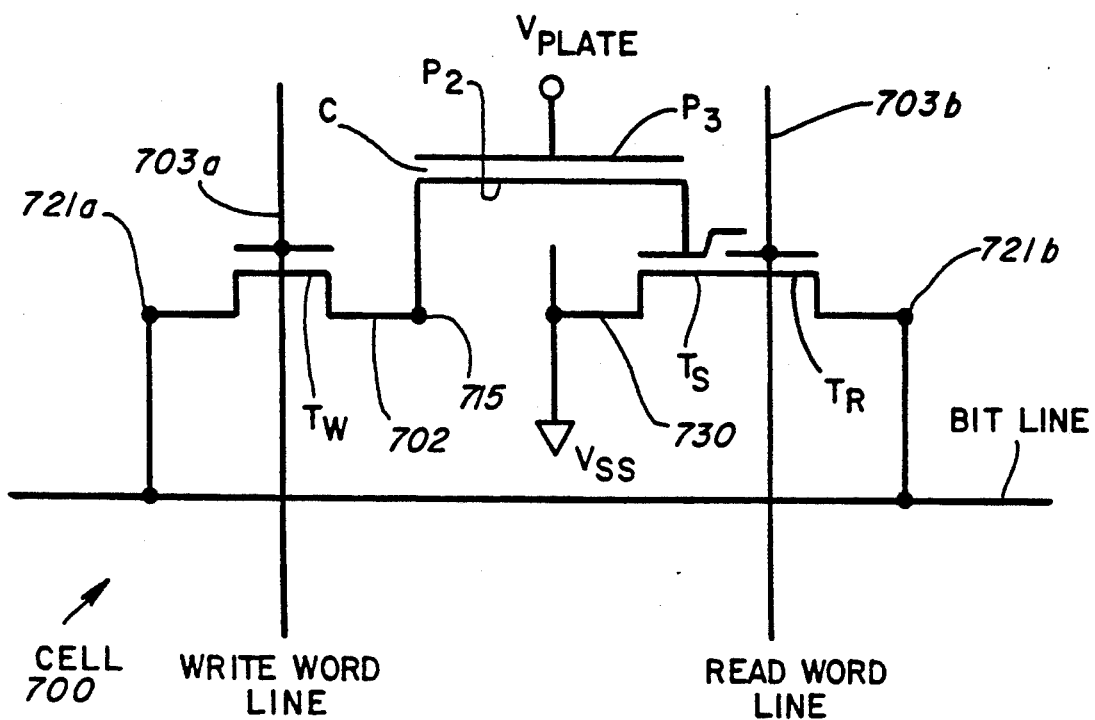

FIG. 4a provides a top view and FIG. 4b provides a cross sectional view of one of several possible self amplifying DRAM cells constructed in accordance with the teachings of this invention. FIG. 4c provides a circuit schematic of the same cell. Cell 700 employs polysilicon layer $P_2$ to form capacitor plate 714 of storage capacitor C to not only store charge, but also to serve as the gate of MOS sensing (read) transistor $T_s$, which is connected in series with a select read transistor $T_R$. Charge is written onto or removed from capacitor C only through write transistor $T_W$. Source 702 of write transistor $T_W$ is connected through buried contact opening 715 to storage plate $P_2$. Polysilicon layer $P_3$ is used to form the second capacitor plate, 704, which is held at a fixed potential $V_{plate}$ (i.e. ground or VCC). Metal bit line 711 contacts drains 701W and 701R of write and read transistors $T_W$ and $T_R$, through via openings 721a and 721b, respectively. In an alternative embodiment, separate bit lines are used for the write and read transistors. Sensing transistor $T_S$ has a buried source diffusion 730 held at ground potential.

Cell 700 operates in the following manner. To write the cell, read word line 703b is held low to turn off read transistor $T_R$, and write word line 703a is brought high to turn on write transistor $T_W$. Bit line 711 is either high or low, depending on the data to be written. The bit line potential is written into storage capacitor C and the write word line is brought low, turning off write transistor $T_W$. To read the cell, read word line 703b is brought high, turning on read transistor $T_R$. If the stored state is high, series sensing transistor $T_S$ is turned on, and the precharged potential on bit line 711 is pulled to the $V_{SS}$ potential through read transistor $T_R$ and sense transistor $T_S$. If, however, the stored state is low, sense transistor $T_S$ remains off even when read transistor $T_R$ is on, thereby preventing discharge of bit line 711 towards VSS potential. The bit line potential in either case is compared to a reference bit line potential to differentiate between the two states. The read signal represents an amplification by sense transistor $T_S$ of the charge stored on capacitor C, as opposed to standard DRAMs in which the stored charge is dumped directly onto the bit line without any local amplification. The read operation is nondestructive and need not be followed by a refresh operation as in all standard DRAMs. Periodic refresh is required only to replenish stored charge lost through leakage at junction 702 to the substrate. In a refresh operation the stored state is first read (read transistor $T_R$ on) onto the bit line and then written into capacitor C (write transistor $T_W$ turned on, with $T_R$ either on or off) from the same bit line.

Because of the local signal amplification, cell 700 provides faster read, more stable storage (much better signal-to-noise ratio), and significantly reduced sensitivity to bit line related soft errors arising from alpha particles hits.

Self Amplifying DRAM With Multiple State Storage

The combination of local signal amplification and the large storage capacity inherent in the $S^2C$ structure lends itself to making cell 700 ideally suited for multiple state storage (i.e., more than one bit stored per cell). Multiple state storage is accomplished with cell 700 by writing into capacitor C one of more than two voltage potentials (this can even be a continuum of potentials for storing analog signals) supplied through bit line 711. Each of these potentials in turn provides a different gate voltage for sensing transistor $T_S$. During reading, the cell can therefore have one of several conductance states, each of which can be compared to several intermediate reference conductance levels. This can be quite similar to the prior art Furuyama 2-bit cell RAM (previously described), with the exception that in cell 700 the read operation is non-destructive and therefore time is available to develop a stable signal level, in contrast with the prior art Furuyama cell where the read signal is transitory and of very small magnitude.

One further embodiment utilizing cell, 700 includes sensing transistor $T_s$ which is fabricated to have a zero or negative (i.e., depletion) turn on threshold voltage, as a means to increase the read transconductance as well as to further open the voltage potential window available for multiple state storage. Of importance, such a depletion threshold voltage is not possible with the prior art Furuyama cell because it would cause the charge to leak out through this transistor.

Using cell 700 as a 2 bits/cell selfamplifying device results in silicon area per bit as well as storage capacitance per bit approximately equal to the single transistor, non-amplifying cell 500, yet the read is faster and the device operation is more stable. The only penalty, then, is in the increased number of sense amplifiers needed to differentiate between the more than two stored states.

Multiport DRAMs with Sidewall storage Capacitor Structure and Self Signal Amplification of the Stored State The S$^2$C DRAM cell with transistor signal amplification described above can be extended to DRAM cells with several ports for writing and several ports for reading for each given address in an array of memory cells. For example, a cell can be written from any one of several inputs and read by any one of several outputs. Peripheral circuitry can be used to arbitrate access from different write ports into the same address, but it is possible to simultaneously write data into one address and read data stored in another address, or to read data from two different addresses simultaneously.

Prior art multiport RAM (other than the Sakurai dual port RAM referenced above) have been implemented using cross-coupled inverters in a bistable flip-flop configuration as the storage element. An example of such a prior art dual port RAM cell is shown in FIG. 5c. These prior art multiport RAMs result in rather large cells and have therefore been rather restricted in the size of the array or in the number of ports per cell. This invention allows the implementation of a dynamic multiport RAM which is highly stable yet consumes a relatively small area.

Figure 5A:
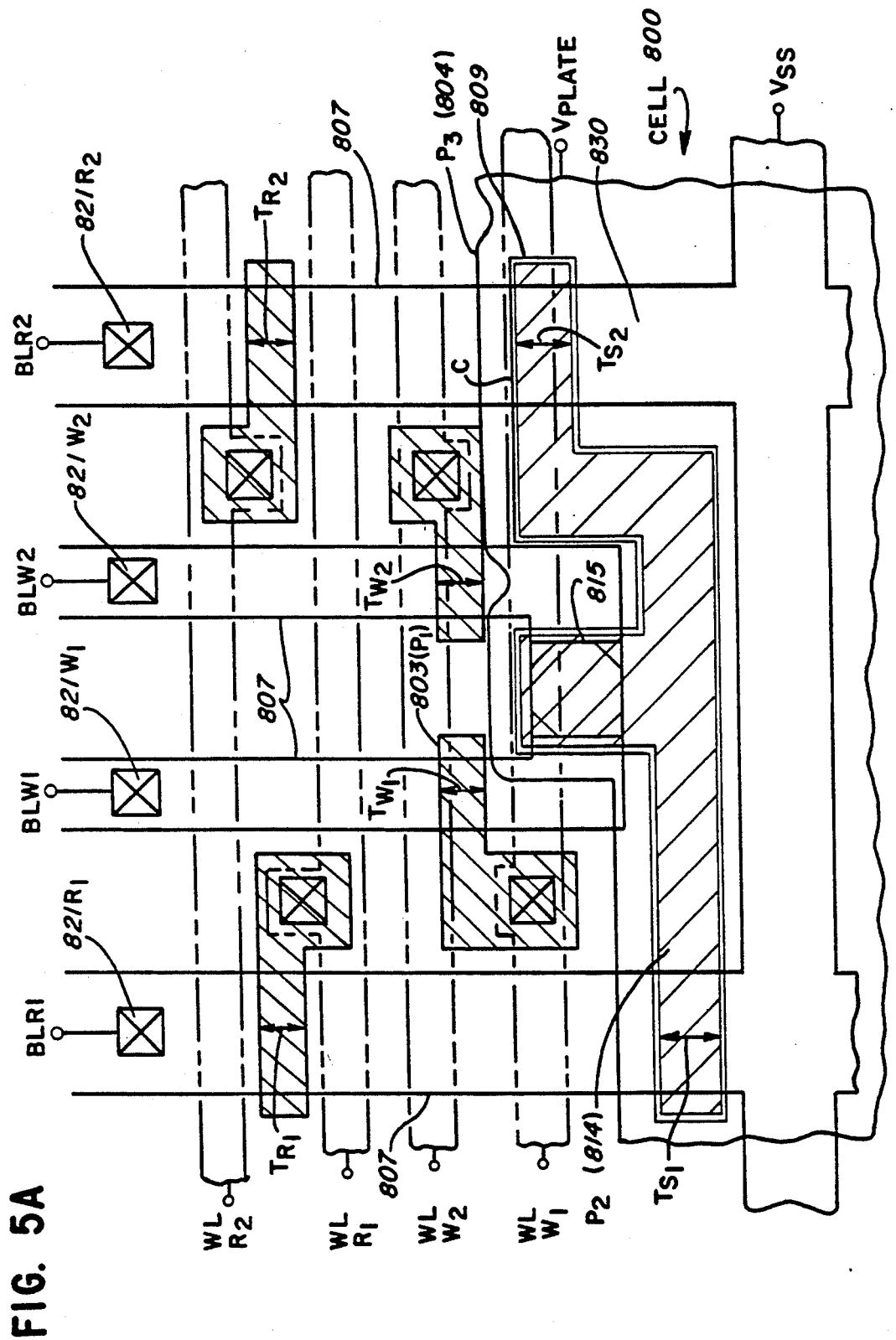
FIG. 5a is a top view of an example of a multiport DRAM with self signal amplification in accordance with this invention.
Figure 5B:
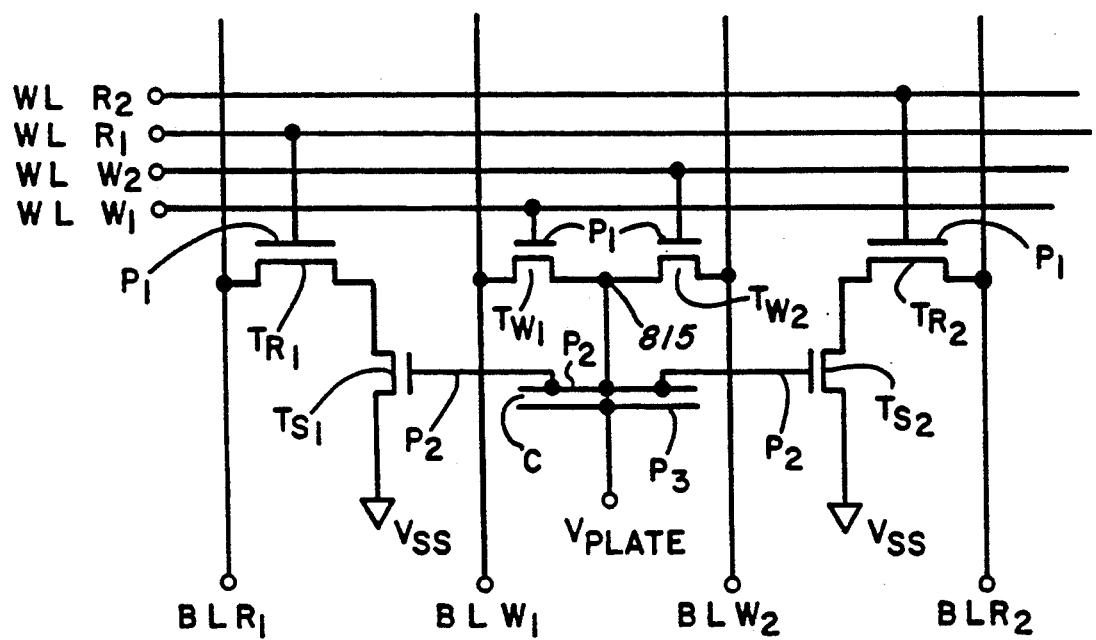
Figure 5C:
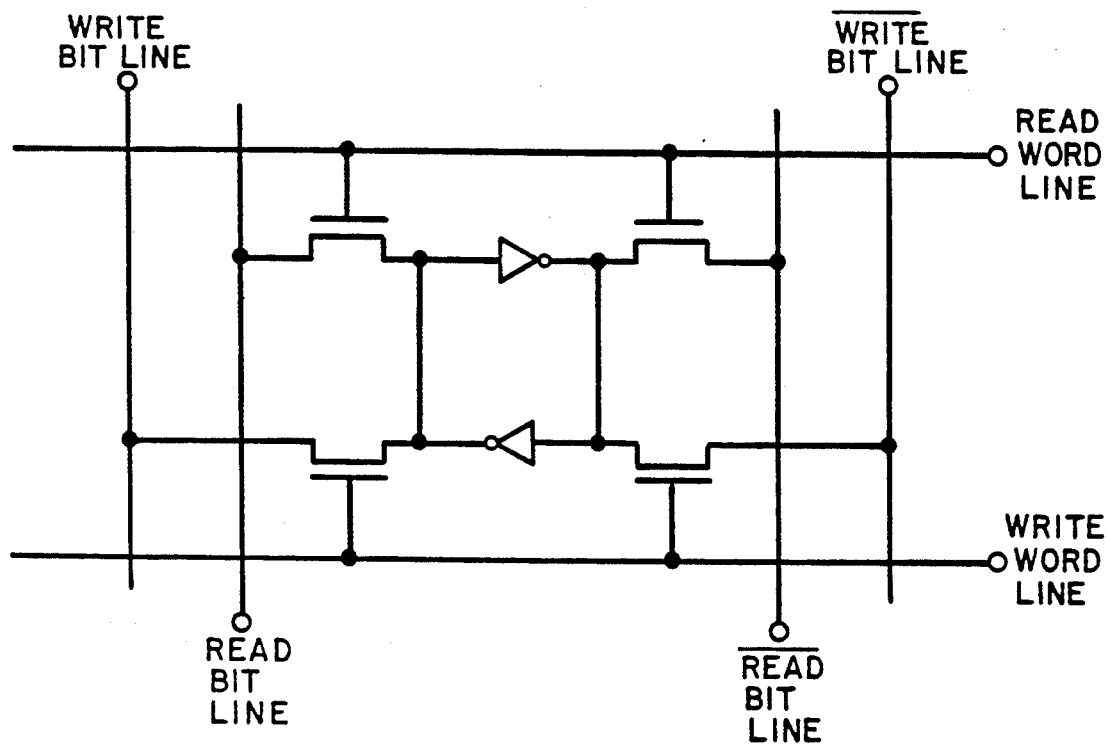
FIG. 5c is a prior art dual port static RAM cell.

An example of a four-port dynamic RAM constructed in accordance with this invention is shown as cell 800 in FIG. 5a in top view. A circuit schematic representation of the same embodiment is shown in FIG. 5b. Cell 800 provides two independent ports for writing data into the cell and two more independent ports for reading the stored data. The cell has four word lines (WLR1, WLR2 for read, WLW1, WLW2 for write) and four bit lines (BLR1, BLR2 connected to sense amplifiers and BLW1, BLW2 connected to data input buffers). To write data, either one of write transistors $T_{W1}$ or $T_{W2}$ is turned on and data is written from BLW1 or BLW2 onto capacitor C through a shared buried contact 815. Storage capacitor C is implemented with thick polysilicon layer $P_2$ as the bottom plate and with polysilicon layer $P_3$ forming the second plate 804, held at potential $V_{plate}$ (normally ground or VCC). Conductive layer $P_2$ also is used to form the gates of two sensing transistors, one for each read port ($T_{S1}$ and $T_{S2}$). To read either of the two read ports, either one of the read transistors $T_{R1}$ or $T_{R2}$ is turned on. The corresponding bit line BLR1 or BLR2 then senses the conduction state of the read and sense transistors in series. By forming the read and sense transistors with wider channels than write transistors $T_{W1}$ and $T_{W2}$, it is possible to improve their conductance and thereby speed up the access time. Of importance, this read operation is nondestructive; therefore refresh is not required for every read. One of the two write ports and one of the two read ports can be assigned to periodically read/refresh the entire array of cells. Alternatively, an additional dedicated read/write path (using cell 700 where a single bit line is used for read and write access) can be provided for the sole purpose of periodic refresh, freeing all other ports from this task. In this case the multiport cell 800 shares the same $P_2$ plate with the dedicated refresh cell ($P_2$ connects between buried contact opening 815 of the multiport cell and the buried contact opening of the dedicated attached refresh cell).

In the implementation of FIG. 5a, the word lines consist of metal 1 lines each contacting one of the gates of the four access transistors. The four bit lines can be implemented in metal 2, with each line contacting one of the bit lines through via openings 821R1, 821W1, 821W2 or 821R2. (Metal 2 bit lines are not shown in FIG. 5a to avoid crowding the figure. They run perpendicular to the direction of the metal 1 word lines).

One of the problems encountered in the manufacture of cell 800 is step coverage for metal 1 and metal 2, particularly when these conductors must cross over the steep walls of capacitor plate $P_2$. However, comparing the capacitor area (dark border and top surface of $P_2$) for cell 800 with that for cell 500 (FIG. 2b) it is evident that the storage capacity is as much as five times larger for cell 800. Therefore it is possible to reduce the thickness of $P_2$ to 1.0 micron or even less and still maintain more than adequate cell capacitance for a stable multiport RAM operation. With this reduction in thickness of $P_2$ (layer 814) to approximately 1.0 micron, the step coverage problem is essentially eliminated. It is also possible to fabricate a multiport DRAM such as cell 800 in FIG. 5b without using three levels of polysilicon. For example, the lower storage capacitor plate corresponding to $P_2$ in FIG. 5a as well as the gates of the sense transistors can be implemented instead in the first polysilicon layer $P_1$, and the second capacitor plate (corresponding to $P_3$ in FIG. 5a) as well as the gates of the read and write transistors can be implemented instead in the second polysilicon layer $P_2$, thereby eliminating one layer of polysilicon. (The reason for not doing so in cells 500, 600, and 700 is that these cells would end up being considerably larger if only two layers of polysilicon were used.) Cell 800 on the other hand has a surface area which to a large extent is dictated by the requirements for metal 1 and metal 2 line width and spacing. Therefore there is less of an advantage for using the highly compact triple polysilicon S$^2$C structure.

Multiport DRAM with Multistate Storage

Multiport DRAM cell 800 is considerably smaller than any equivalent prior art multiport RAM cell. Nevertheless, its storage efficiency can be further improved by using each cell to store more than one bit (i.e., more than two conduction states). The principle of operation is identical to the multistate self-amplifying S$^2$C cell 700 described in above. The relatively large storage capacity C inherent to cell 800 allows very stable operation in 4, 8, or 16-state multiport storage (i.e., 2, 3, or 4 bits per cell). The penalty associated with this cell is that each read port must have more complex sense amplifiers having several reference levels and each write port must be capable of writing multiple voltage levels into the cell. Nevertheless, this is a worthwhile tradeoff since it can increase the storage capacity by a factor of 2, 3, or 4.

Techniques to Further Enhance the Storage Capacitance

Figure 6A:
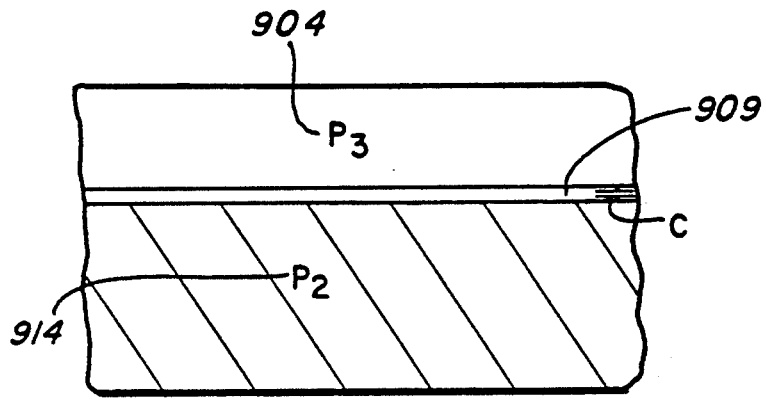
FIG. 6a is a microscopic view of a capacitor having a flat surface.
Figure 6B:
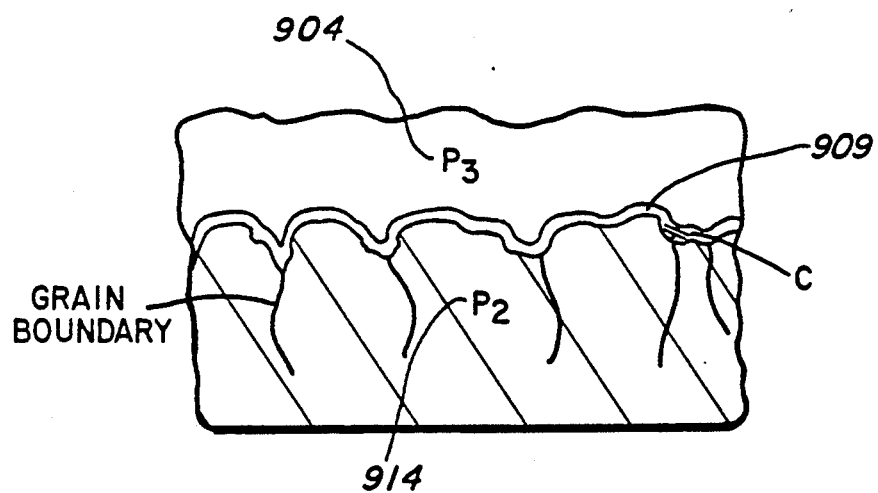
FIG. 6b is a microscopic view of a capacitor whose surface has been chemically treated to accentuate the grainy structure of the polysilicon.

Cells 500, 600, 700, and 800 can have the storage capacity of capacitor C increased without increasing the area taken up by the cell, using one of several techniques:

1. The vertical walls and top surface of polysilicon electrode $P_2$ can be treated chemically or otherwise to accentuate the grainy structure of the polycrystallite silicon layer, thereby increasing the surface roughness and hence the surface area available for storage capacitor C. The grain boundaries of N+ doped polysilicon act as dopant aggregate centers and are therefore much more heavily doped than the polycrystallite silicon grains. Any chemical solution which preferentially etches heavily N+ doped silicon will etch layer $P_2$ faster along the grain boundaries, resulting in a rougher surface. FIGS. 6a and 6b show a microscopic view of capacitor C for the two cases of a flat $P_2$ surface (FIG. 6a) and a chemically treated surface (FIG. 6b). Since storage dielectric 909 is very thin, typically 6 to 12 nanometers, it essentially reproduces the surface topology of $P_2$. It is possible through this technique to increase the value of C by as much as 100%. In this case, it is possible to correspondingly reduce the height of the vertical walls of electrode $P_2$. It should be noted that this technique cannot be applied to the vertical walls of a trench etched into the silicon substrate because the exposed silicon is single crystal, having no grain boundaries for preferential etching.

Another way to accentuate the grainy structure is to grow a relatively thick thermal silicon dioxide on the surface of $P_2$ and then etch it away prior to growing or depositing storage dielectric 909.

2. The vertical walls (514r, 514l, 514f, and 514b in FIGS. 2a and 2b) can be etched at a small slope to increase their surface area.

3. A hybrid between the $S^2C$ and the trench capacitor can result in a capacitor C having an electrode $P_2$ with vertical walls which need not be very high and a trench capacitor whose trench need not be very deep. The hybrid of the two approaches can result in adequate storage capacity per cell without the difficulties associated with very tall vertical sidewalls or very deep trenches. An example of such a hybrid storage capacitor is shown in the crosssectional view of FIG. 7. Cell 1000 has capacitor C formed in part along the top and sidewall surfaces of $P_2$ electrode 1014 and partially along the N+ doped vertical walls 1016 and bottom surface of a shallow trench. The second storage electrode 1004 completely fills the trench. Although polysilicon layer $P_3$ may not completely planarize the topology above the silicon surface, the fact that polysilicon layer $P_2$ within cell 1000 is not as tall as polysilicon layer $P_2$ within cell 500 reduces the overall planarization requirement. In all other respects, cell 1000 is identical to cell 500.

Other Embodiments

Figure 8A:
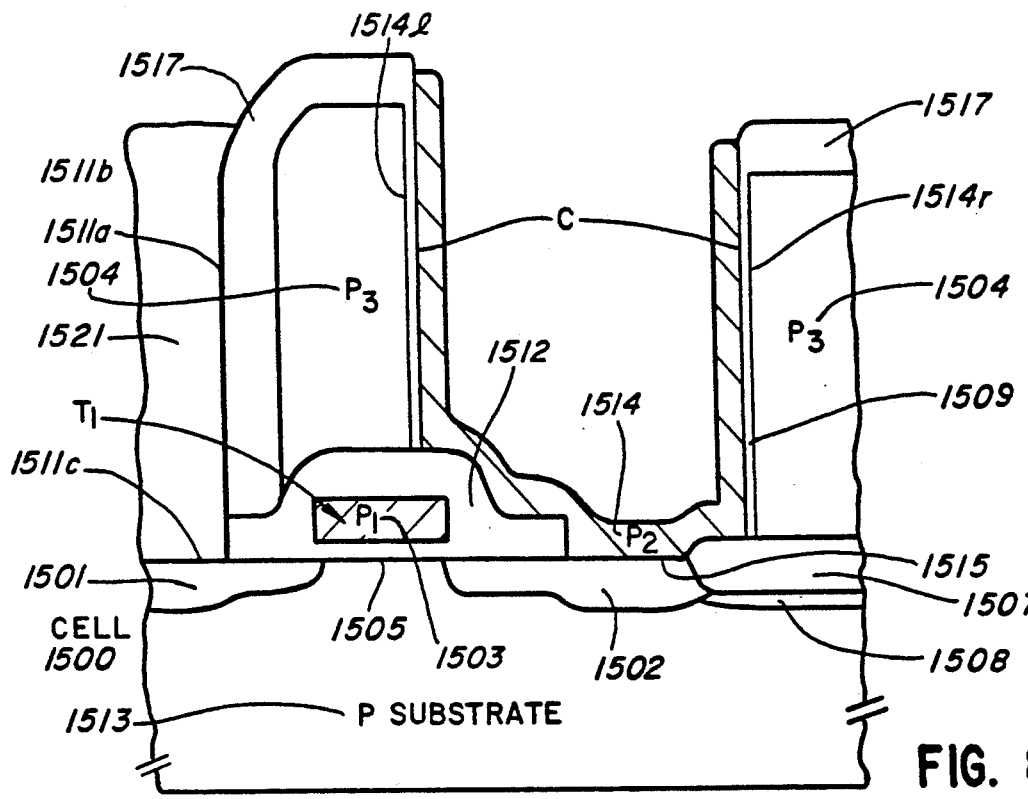
FIG. 8a is a cross sectional view of another embodiment of an S$^2$C DRAM cell.
Figure 8B:
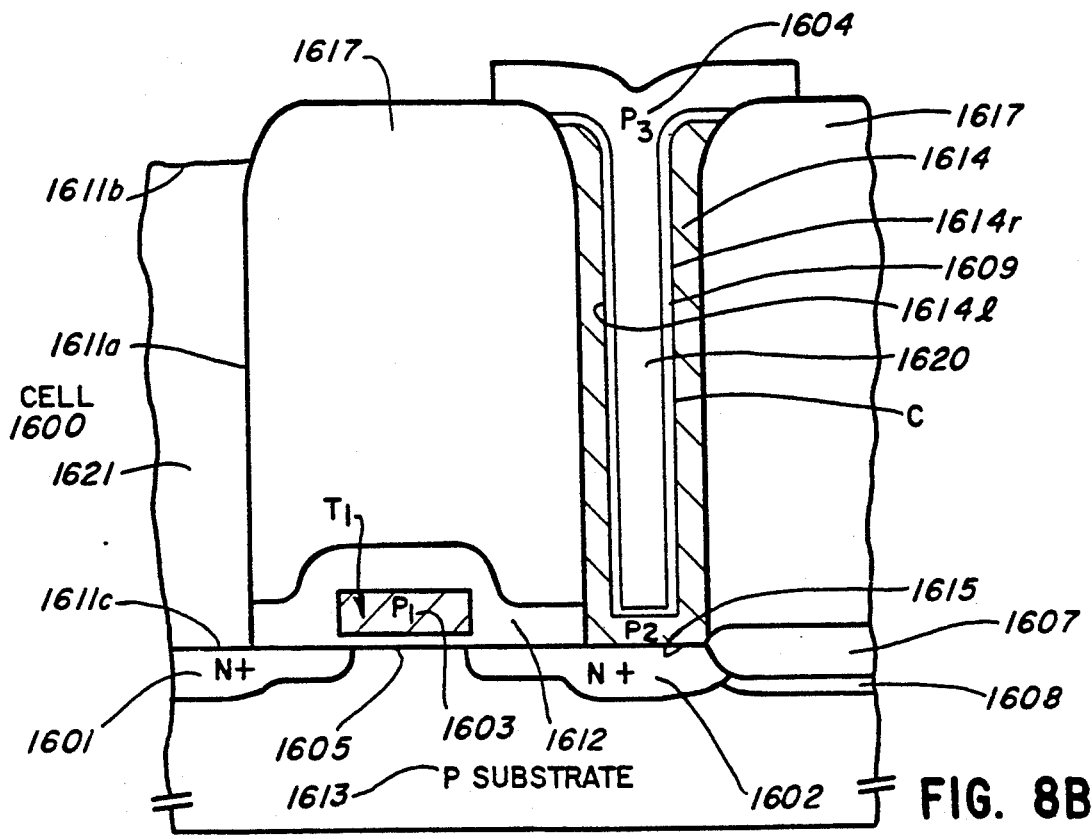
FIG. 8b is a cross sectional view of yet another embodiment of an S$^2$C DRAM cell.

The vertical sidewall storage structure of cell 500 (FIGS. 2a, 2b) can be modified to obtain different DRAM cells, each still possessing the benefits of the additional storage area along vertical walls of the storage capacitor. Two such modifications —cells 1500 and 1600—are shown in cross section in FIGS. 8a and 8b respectively. In these figures, equivalent indexing is used, to simplify comparing between the three cells. For example, 515, 1515 and 1615 all refer to a buried contact opening to allow ohmic contact between one of the two storage plates $P_2$ and the source diffusion 502, 1502 or 1602.

Referring specifically to cell 1500, capacitor C is formed primarily at the storage dielectric 1509 along the vertical walls between electrodes $P_2$ and $P_3$. Contrary to cell 500, plate $P_3$ (1504) is formed before electrode $P_2$. Also, in cell 1500 plate $P_3$ is thick, providing the vertical sidewalls for added storage capacity C, while the thickness of plate $P_2$ has no bearing on the magnitude of C. Cell 1500 requires planarization (not shown) of the hole created in the surface topology where $P_2$ is located.

In cell 1600 (FIG. 8b), neither of the plates $P_2$ (1614) nor $P_3$ is thick. Instead, dielectric isolation layer 1617 is deposited thick to provide the tall vertical walls of storage capacitor C. Narrow vias are etched in dielectric 1617 with vertical walls extending down to source diffusion 1602 (which is the storage junction) as well as to drain diffusion 1601 (which will be connected to the bit line through via plug 1621 contacting the drain at 1611C). Capacitor C with vertical walls 1614l, 1614r is formed between a very thin conductive plate $P_2$ and conductive plate $P_3$ (1604) which is sufficiently thick to fill cavity 1620. Either one of electrodes $P_2$ or $P_3$ or both can also be used in lieu of plug material 1621 to provide electrical contact from bit line to drain. The storage capacitor C of cell 1600 is quite similar to the trench storage capacitor C of prior art cell 400 (FIG. 1d), except that the former has two significant advantages. First, there is a natural etch stop at the interface between dielectric 1617 and the silicon substrate 1613. Therefore it is possible to guarantee uniform storage capacity for all cells in a memory array. Second, by elevating C above the surface of the substrate, the charge stored at C achieves far greater immunity to soft errors than trench capacitors implemented below the surface of the substrate.

Figure 7:
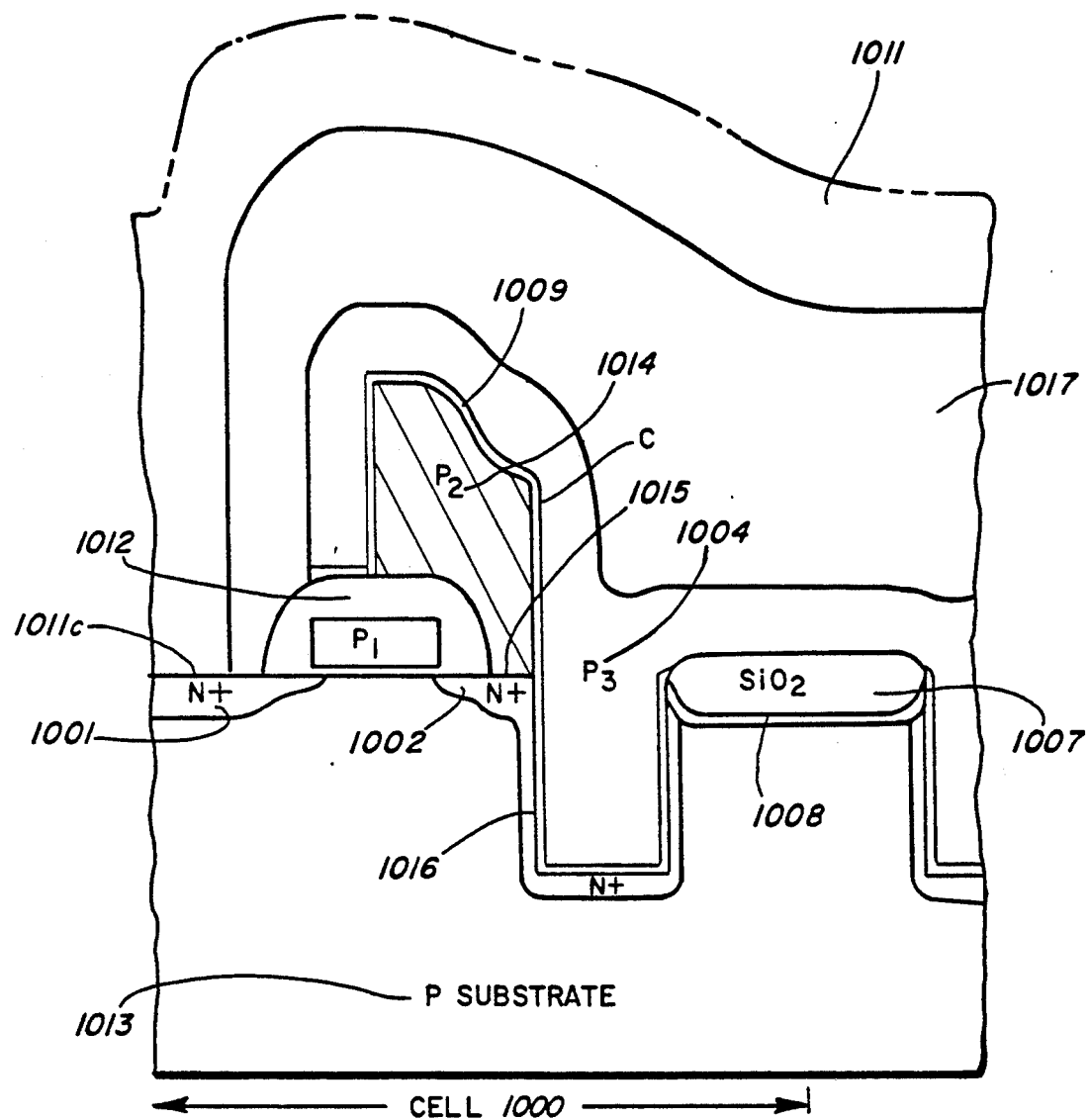
FIG. 7 is a cross sectional view of a DRAM cell which is a hybrid between the S$^2$C and trench capacitors.

Comparing cells 500, 1500, and 1600, cells 500 and 1500 have approximately the same process complexity, the same storage efficiency, and approximately the same step coverage difficulty. Cell 1600 on the other hand may be somewhat easier to make, and provides less of a step coverage problem. Its disadvantage relative to cell 500 is that it is less flexible for using electrode $P_2$ as the gate of a sense transistor in self signal amplification cells or in multiple port DRAM cells. It is also somewhat less efficient for charge storage because the area of vertical sidewalls inside the via etched in dielectric 1617 is less than that possible with cells 500 or 1500. Of course, it is possible to increase the height of the vertical sidewalls of storage capacitor C of cell 1600 by forming part of the capacitor inside the substrate by etching a shallow trench into source diffusion 1602 in buried contact opening 1615, in a manner akin to the hybrid capacitor of cell 1000 (FIG. 7).

All publications and patent applications are herein incorporated by reference to the same extent as if each individual publication or patent appliction was specifically and individually indicated to be incorporated by reference.

The description provided herein is meant to be exemplary only, and not limiting. Various cells can be formed to optimize specific characteristics and improve upon self aligning features. Although the foregoing invention has been described in some detail by way of illustration and example for purposes of clarity of understanding, it will be readily apparent to those of ordinary skill in the art in light of the teachings of this invention that certain changes and modifications may be practiced within the scope of the appended claim.

What is claimed is:

1. A dynamic RAM cell comprising:
an MOS transfer transistor formed in a semiconductor substrate and having a source region, a drain region, a channel region, and an insulated gate, said transfer transistor being used for selectively writing data into and reading data out of said RAM cells;
a storage capacitor comprising:
a first electrode formed of a first conductive layer, said first electrode being of a granular material and being electrically connected to said source region;
a second conductive electrode overlying said first electrode; and
a storage dielectric insulating layer located between said first and second electrodes;
a bit line connected to said drain; and
a word line connected to said insulated gate,
wherein said first electrode is formed to have an irregular surface formed along the surfaces of the grain boundaries of said first electrode and said storage dielectric and said second conductive electrode substantially follows the contours of said first electrode, thereby increasing the capacitance of said storage capacitor.

2. A cell as in claim 1 wherein said first conductive electrode comprises polycrystalline silicon.

3. A cell as in claim 2 wherein said irregular surface is formed by etching said polycrystalline silicon preferentially along grain boundaries.

4. A cell as in claim 2 wherein said irregular surface is formed by firs growing a relatively thick silicon dioxide on the surface of said polycrystalline silicon and then etching said silicon dioxide.

5. A cell as in claim 4 wherein said storage dielectric insulating layer is formed after said etching of said silicon dioxide.

6. A cell as in claim 1 wherein said storage dielectric insulating layer is sufficiently thin so as to essentially reproduce the surface topology of said irregular surface thereby to substantially increase the capacitance of said storage capacitor.

7. A cell as in claim 1 wherein said storage dielectric insulating layer comprises a layer of silicon dioxide, silicon nitride, a sandwich of silicon dioxide and partially oxidized silicon nitride, or a dielectric material having a dielectric constant higher than the dielectric constant of silicon dioxide.

8. A capacitor as in claim 2 wherein said second electrode comprises a layer of polycrystalline silicon.

* * * * *

UNITED STATES PATENT AND TRADEMARK OFFICE
CERTIFICATE OF CORRECTION

PATENT NO. : 5,327,375
DATED : July 5, 1994
INVENTOR(S) : Eliyahou Harari

It is certified that error appears in the above-indentified patent and that said Letters Patent is hereby corrected as shown below:

Column 18, line 9, claim 4, delete "firs" and insert --first--.

Signed and Sealed this

Fifteenth Day of November, 1994

Attest:

BRUCE LEHMAN

Attesting Officer

Commissioner of Patents and Trademarks

REEXAMINATION CERTIFICATE (3752nd)
United States Patent [19]
Harari

[11] B1 5,327,375
[45] Certificate Issued Mar. 16, 1999

[54] DRAM CELL UTILIZING NOVEL CAPACITOR

[76] Inventor: Eliyahou Harari, 2320 Friars La., Los Altos, Calif. 94022

Reexamination Requests:
No. 90/004,093, Dec. 29, 1995
No. 90/004,531, Jan. 28, 1997

Reexamination Certificate for:
Patent No.: 5,327,375
Issued: Jul. 5, 1994
Appl. No.: 24,917
Filed: Mar. 2, 1993

Related U.S. Application Data

[60] Continuation of Ser. No. 868,793, Apr. 15, 1992, abandoned, which is a division of Ser. No. 551,557, Jul. 10, 1990, Pat. No. 5,136,533, which is a division of Ser. No. 216,873, Jul. 8, 1988, Pat. No. 4,958,318.

[51] Int. Cl.⁶ .................................................. G11C 11/401
[52] U.S. Cl. ................ 365/149; 365/189.04; 365/182; 257/309
[58] Field of Search ...................... 365/149, 189.04, 365/182, 52, 174; 257/309

[56] References Cited

U.S. PATENT DOCUMENTS

| | | |
|---|---|---|
| 4,099,196 | 7/1978 | Simko . |
| 4,274,012 | 6/1981 | Simko . |
| 4,300,212 | 11/1981 | Simko . |
| 4,314,265 | 2/1982 | Simko . |
| 4,404,577 | 9/1983 | Cranford, Jr. et al. . |

(List continued on next page.)

FOREIGN PATENT DOCUMENTS

| | | |
|---|---|---|
| 0 253014 | 1/1988 | European Pat. Off. . |
| 0 282023 | 9/1988 | European Pat. Off. . |
| 0 295709 | 12/1988 | European Pat. Off. . |
| 49-33433 | 3/1974 | Japan . |
| 57-55597 | 4/1982 | Japan . |

(List continued on next page.)

OTHER PUBLICATIONS

Vol. 130, No. 10, Electrical Conduction Through Polysilicon Oxide: Interface Texture vs. Isolated Protuberances, pp. 2117–2119 (Date ?).

Journal of Applied Physics, vol. 38, No. 7, Jun. 1967, Current Transport and Maximum Dielectric Strength of Silicon Nitride Films, pp. 2951–2956.

(List continued on next page.)

*Primary Examiner*—A. Zarabian

[57] ABSTRACT

A dynamic RAM is provided with enhanced charge storage capacity by increasing the surface area between the two electrodes of the storage capacitor. The first electrode consists of a thick conductive layer whose vertical sidewalls provide the extra surface area for charge storage. The second electrode is used to partially planarize the surface topology. The first electrode can also be used as the gate of a sensing transistor in a signal amplifying cell, as well as in multiport and multi-state dynamic RAM cells.

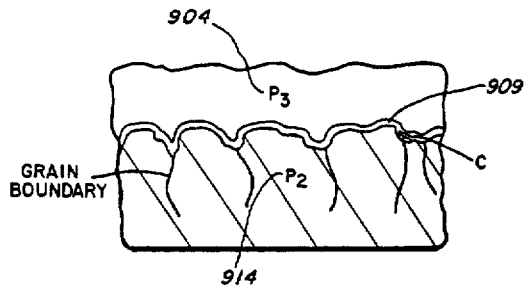

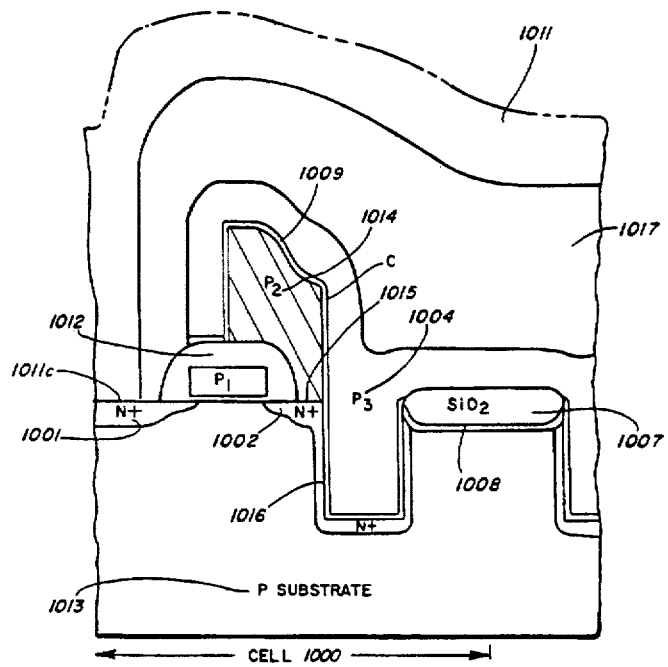

U.S. PATENT DOCUMENTS

| | | |
|---|---|---|
| 4,455,568 | 6/1984 | Shiota . |
| 4,486,769 | 12/1984 | Simko . |
| 4,503,519 | 3/1985 | Arakawa . |
| 4,561,004 | 12/1985 | Kuo et al. . |
| 4,577,390 | 3/1986 | Haken . |
| 4,613,956 | 9/1986 | Paterson et al. . |
| 4,615,020 | 9/1986 | Rinerson et al. . |
| 4,621,277 | 11/1986 | Ito et al. . |
| 4,641,166 | 2/1987 | Takemae et al. . |
| 4,688,078 | 8/1987 | Hseih . |
| 4,697,330 | 10/1987 | Paterson et al. . |
| 4,706,102 | 11/1987 | Pan et al. . |
| 4,720,323 | 1/1988 | Sato . |
| 4,735,915 | 4/1988 | Kita et al. . |
| 4,735,919 | 4/1988 | Faraone . |
| 4,742,018 | 5/1988 | Kimura et al. . |
| 4,757,360 | 7/1988 | Faraone . |
| 4,758,986 | 7/1988 | Kuo . |
| 4,763,299 | 8/1988 | Hazani . |
| 4,768,080 | 8/1988 | Sato . |
| 4,774,202 | 9/1988 | Pan et al. . |
| 4,811,076 | 3/1989 | Tigelaar et al. . |
| 4,845,538 | 7/1989 | Hazani . |
| 4,845,544 | 7/1989 | Shimizu . |
| 4,851,370 | 7/1989 | Doklan et al. . |
| 4,874,716 | 10/1989 | Rao . |
| 4,906,590 | 3/1990 | Kanetaki et al. . |
| 4,912,055 | 3/1990 | Min et al. . |
| 4,922,312 | 5/1990 | Coleman et al. . |
| 4,924,437 | 5/1990 | Paterson et al. . |
| 4,933,904 | 6/1990 | Stewart et al. . |
| 4,937,650 | 6/1990 | Shinriki et al. . |
| 4,947,221 | 8/1990 | Stewart et al. . |
| 4,951,175 | 8/1990 | Kurosawa et al. . |
| 5,047,814 | 9/1991 | Hazani . |
| 5,099,297 | 3/1992 | Hazani . |
| 5,166,904 | 11/1992 | Hazani . |
| 5,180,683 | 1/1993 | Wakamiya et al. . |

FOREIGN PATENT DOCUMENTS

| | | |
|---|---|---|
| 57-92494 | 6/1982 | Japan . |
| 57-112066 | 7/1982 | Japan . |
| 57-169531 | 10/1982 | Japan . |
| 58-151056 | 9/1983 | Japan . |
| 58-213461 | 12/1983 | Japan . |
| 59-56754 | 4/1984 | Japan . |
| 59-105371 | 6/1984 | Japan . |
| 59-154070 | 9/1984 | Japan . |
| 59-188963 | 10/1984 | Japan . |
| 60-18818 | 1/1985 | Japan . |
| 60-76171 | 4/1985 | Japan . |
| 60-117675 | 6/1985 | Japan . |
| 60-167472 | 8/1985 | Japan . |
| 61-12055 | 1/1986 | Japan . |
| 61-23661 | 2/1986 | Japan . |
| 61-171167 | 8/1986 | Japan . |
| 61-225872 | 10/1986 | Japan . |
| 61-239642 | 10/1986 | Japan . |
| 61-296761 | 12/1986 | Japan . |
| 62-48062 | 3/1987 | Japan . |
| 62-128168 | 6/1987 | Japan . |
| 62-234360 | 10/1987 | Japan . |
| 62-286269 | 12/1987 | Japan . |
| 62-286270 | 12/1987 | Japan . |
| 63-62370 | 3/1988 | Japan . |
| 64 42161 | 2/1989 | Japan . |

OTHER PUBLICATIONS

Journal of Applied Physics, vol. 48, No. 11, Nov. 1977, Evidence for Surface Asperity Mechanism Of Conductivity In Oxide Grown . . . pp. 4834–4836.

Electronics, Oct. 11, 1979, 5–Volt–Only, Nonvolatile RAM Owes It All To Polysilicon, pp. 111–116.

Electro/80 Conference Record, May 13–15, 1980, Boston, MA, pp. 1–4.

Wescon/80 Conference Record, Sep. 16–18, 1980, Anaheim, CA, p. 7.

Electronics, Jun. 30, 1982, 5–Volt–Only EE–PROM Mimics Static–RAM Timing, by George Landers, pp. 127–130.

Electronic Engineering, Jun. 1982, 16K $E^2$ PROM With New Array Architecture, by G. Yaron, et al., pp. 35–47.

J. Electrochem. Soc.: Solid–State Science and Technology, Jun. 1982, vol. 129, No. 6, Polysilicon/$SiO_2$ Interface Microtexture and Dielectric . . . pp. 1282–1289.

J. Appl. Phys. 53(9), Sep. 1981, Electrical Conduction and Breakdown In Oxides Of Polycrystalline Silicon and Their Correlation With Interface . . . pp. 6240–6245.

International Electron Devices Meeting, San Francisco, CA, Dec. 13–14, 1982, Technical Digest, pp. 749–752.

1984 Symposium On VLSI Technology, Digest of Technical Papers, San Diego, CA, Sep. 10–12, 1984, pp. 40 and 41.

International Electron Devices Meeting, San Francisco, CA, Dec. 9–12, 1984, Technical Digest, pp. 173–176, 480–483.

23rd Annual Proceedings, Reliability Physics 1985, Orlando, Florida, Mar. 26–28, 1985, pp. 11–17, 18–23.

1985 Symposium On VLSI Technology, Digest of Technical Papers, Kobe, Japan, May 14–16, 1985, pp. 98 and 99.

Insulating Films On Semiconductors, J.J. Simonne and J. Buxo (editors), pp. 119–123.

Appl. Phys. Lett. 48(2), 13 Jan. 1986, Superior Characteristics Of Nitridized Thermal Oxide Grown On Polycrystalline Silicon, pp. 165–167.

Electronics, May 12, 1986, Thick Oxide Beats Thin Film In Building Big EEPROMS, pp. 30–32.

1986 Symposium On VLSI Technology, Digest of Technical Papers, San Diego, CA, May 28–30, 1986, pp. 71 and 72.

IEEE Transactions On Electron Devices, vol. ED–33, No. 11, Nov. 1986, A Model For The Electrical Conduction In Polysilicon Oxide, pp. 1809–1815.

25th Annual Proceedings, Reliability Physics 1987, San Diego, CA, Apr. 7–9, 1987, Highly Reliable Trench Capacitor . . . , pp. 50–54.

25th Annual Proceedings, Reliability Physics 1987, San Diego, CA, Apr. 7–9, 1987, Reliability of Nano–Meter Thick Multi–Layer Dielectric . . . pp. 55–59.

25th Annual Proceedings, Reliability Physics 1987, San Diego, CA, Apr. 7–9, 1987, Reliability Comparison of Flotox and Textured–Polysilicon . . . pp. 85–92.

Solid State Devices and Materials, Tokyo, Japan, Nippon Toshi Center, Aug. 25–27, 1987, pp. 211–214.

Solid State Devices, Proceedings Of The 17th European Solid State Device Research Conference, ESSDERC '87, Bologna, Italy, 14–17 Sep. 1987 pp. 157–168.

The Effect of Low Pressure On The Structure of LPCVD Polycrystalline Silicon Films by P. Joubert, et al., pp. 2541–2545.

IEEE Transactions On Electron Devices, vol. 36, No. 5, May 1989, Lifetime Of Thin Oxide–Nitride–Oxide Dielectrics within Trench Capacitors . . . pp. 913–919.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2–5 and 8 are cancelled.

Claim 1 is determined to be patentable as amended.

Claims 6 and 7, dependent on an amended claim, are determined to be patentable.

New claims 9–15 are added and determined to be patentable.

1. A dynamic RAM cell comprising:
   an MOS transfer transistor formed in a semiconductor substrate and having a source region, a drain region, a channel region, and an insulated gate, said transfer transistor being used for selectively writing into and reading data out of said RAM cell[s];
   a storage capacitor comprising:
      a first electrode formed of a first conductive layer, said first electrode being of a granular *polycrystalline silicon* material and being electrically connected to said source region;
      a second conductive electrode overlying said first electrode; and
      a *substantially uniformly thin* storage dielectric insulating layer located between said first and second electrodes;
   a bit line connected to said drain; and
   a word line connected to said insulated gate,
   wherein said first electrode is formed to have an irregular surface formed along surfaces of the grain boundaries *and said irregular surface is accentuated to increase the surface area* of said first electrode [and] *by preferentially oxidizing said polycrystalline silicon at the grain boundaries of said granular polycrystalline silicon material, then removing the resulting thermal oxide prior to the formation of said storage dielectric, said storage dielectric* and said second electrode substantially follow the contours of said first electrode, thereby increasing the capacitance of said storage capacitor.

9. *A dynamic RAM cell comprising:*
   *a MOS transfer transistor formed in a semiconductor substrate and having a source region, a drain region, a channel region, and an insulated gate, said transfer transistor being used for selectively writing data into and reading data out of said RAM cell;*
   *a storage capacitor comprising:*
      *a first electrode formed of a first conductive layer, said first electrode being of a granular polysilicon material having an irregular surface and being electrically connected to said source region;*
      *a second conductive electrode overlying said first electrode; and*
      *a substantially uniformly thin storage dielectric insulating layer located between said first and second electrodes;*
   *a bit line connected to said drain; and*
   *a word line connected to said insulated gate, wherein said irregular surface is accentuated to increase the surface area of said first electrode by preferentially etching said polycrystalline silicon at the grain boundaries of said granular polycrystalline silicon material prior to the formation of said storage dielectric, thereby increasing the capacitance of said storage capacitor.*

10. *A cell as in claim 1 wherein said grain boundaries are heavily N+ doped to enhance the oxidation rate of said thermal oxide.*

11. *A cell as in claim 9 wherein said grain boundaries are heavily N+ doped to enhance the etch rate of said preferential etching.*

12. *A dynamic RAM cell comprising:*
   *an MOS transfer formed in a semiconductor substrate and having a source region, a drain region, a channel region, and an insulated gate, said transfer transistor being used for selectively writing into and reading data out of said RAM cell;*
   *a storage capacitor comprising:*
      *a first electrode formed of a first conductive layer, said first electrode being of a granular polycrystalline silicon material having an irregular granular surface formed by oxidizing said polycrystalline silicon at the grain boundaries of said granular polycrystalline silicon material, then removing the resulting thermal oxide, and being electrically connected to said source region;*
      *a second conductive electrode overlying said first electrode; and*
      *a substantially uniformly thin storage dielectric insulating layer formed on said granular surface and located between said first and second electrodes, thereby increasing the capacitance of said storage capacitor;*
   *a bit line connected to said drain; and*
   *a word line connected to said insulated gate,*
   *wherein said accentuated granular polycrystalline silicon surface increases the surface area of said first electrode and said storage dielectric, and said second electrode substantially follow the contours of said first electrode.*

13. *A dynamic RAM cell comprising:*
   *an MOS transfer transistor formed in a semiconductor substrate and having a source region, a drain region, a channel region, and an insulated gate, said transfer transistor being used for selectively writing into and reading data out of said RAM cell;*
   *a storage capacitor comprising:*
      *a first electrode formed of a first conductive layer, said first electrode being of a granular polycrystalline silicon material having an irregular granular surface formed by treating the polycrystalline silicon material to accentuate the granular structure along grain boundaries, and being electrically connected to said source region;*
      *a second conductive electrode overlying said first electrode; and*
      *a substantially uniformly thin storage dielectric insulating layer formed on said granular surface and located between said first and second electrodes, thereby increasing the capacitance of said storage capacitor;* a bit line connected to said drain; and a word line connected to said insulated gate, wherein said polycrystalline silicon material is treated by oxidizing said polycrystalline silicon at the grain boundaries of said granular polycrystalline silicon material, then removing the resulting thermal oxide;

wherein said accentuated granular polycrystalline silicon surface increases the surface area of said first electrode and said storage dielectric and said second electrode substantially follow the contours of said first electrode.

14. A cell as in claims 9, 12 or 13 wherein said storage dielectric insulating layer is sufficiently thin so as to essentially reproduce the surface topology of said irregular surface thereby to substantially increase the capacitance of said storage capacitor.

15. A cell as in claims 9, 12 or 13 wherein said storage dielectric insulating layer comprises a layer of silicon dioxide, silicon nitride, a sandwich of silicon dioxide and partially oxidized silicon nitride, or a dielectric material having a dielectric constant higher than the dielectric constant of silicon dioxide.

* * * * *